(12) United States Patent
Lin

(10) Patent No.: US 6,440,835 B1
(45) Date of Patent: Aug. 27, 2002

(54) METHOD OF CONNECTING A CONDUCTIVE TRACE TO A SEMICONDUCTOR CHIP

(76) Inventor: Charles W. C. Lin, 34 Pinewood Grove, Singapore (SG), 738290

(*) Notice: Subject to any disclaimer, the term of this patent is extended or adjusted under 35 U.S.C. 154(b) by 90 days.

(21) Appl. No.: 09/687,619

(22) Filed: Oct. 13, 2000

(51) Int. Cl.[7] ............................................. H01L 21/44
(52) U.S. Cl. ................................. 438/611; 438/107
(58) Field of Search ............................... 438/106, 107, 438/118, 125, 611, 613, 617

(56) References Cited

U.S. PATENT DOCUMENTS

| | | | |
|---|---|---|---|
| 4,442,967 A | 4/1984 | van de Pas et al. | 228/159 |
| 4,661,192 A | 4/1987 | McShane | 156/292 |
| 4,717,066 A | 1/1988 | Goldenberg et al. | 228/179 |
| 4,750,666 A | 6/1988 | Neugebauer et al. | 228/160 |
| 4,807,021 A | 2/1989 | Okumura | 357/75 |
| 4,925,083 A | 5/1990 | Farassat et al. | 228/102 |
| 4,937,653 A | 6/1990 | Blonder et al. | 357/68 |
| 4,955,523 A | 9/1990 | Calomagno et al. | 228/179 |
| 4,970,571 A | 11/1990 | Yamakawa et al. | 357/71 |
| 4,984,358 A | 1/1991 | Nelson | 29/830 |
| 5,014,111 A | 5/1991 | Tsuda et al. | 357/68 |
| 5,060,843 A | 10/1991 | Yasuzato et al. | 228/179 |
| 5,074,947 A | 12/1991 | Estes et al. | 156/307.3 |
| 5,090,119 A | 2/1992 | Tsuda et al. | 29/843 |
| 5,106,461 A | 4/1992 | Volfson et al. | 205/125 |
| 5,116,463 A | 5/1992 | Lin et al. | 156/653 |
| 5,137,845 A | 8/1992 | Lochon et al. | 437/183 |
| 5,167,992 A | 12/1992 | Lin et al. | 427/437 |
| 5,172,851 A | 12/1992 | Matsushita et al. | 228/179 |
| 5,196,371 A | 3/1993 | Kulesza et al. | 437/183 |
| 5,209,817 A | 5/1993 | Ahmad et al. | 156/643 |
| 5,237,130 A | 8/1993 | Kulesza et al. | 174/260 |
| 5,260,234 A | 11/1993 | Long | 437/203 |
| 5,261,593 A | 11/1993 | Casson et al. | 228/180.22 |

(List continued on next page.)

FOREIGN PATENT DOCUMENTS

| | | | | |
|---|---|---|---|---|
| EP | 0 718 882 A1 | 6/1996 | | H01L/23/057 |
| WO | WO 99/57762 | 11/1999 | | H01L/23/48 |

OTHER PUBLICATIONS

Markstein et al., "Controlling the Variables in Stencil Printing," Electronic Packaging & Production, Feb. 1997, pp. 48–56.

Elenius, "Choosing a Flip Chip Bumping Supplier–Technology an IC Package contractor should look for," Advanced Packaging, Mar./Apr. 1998, pp. 70–73.

(List continued on next page.)

Primary Examiner—David Nelms
Assistant Examiner—Phuc T. Dang
(74) Attorney, Agent, or Firm—David M. Sigmond

(57) ABSTRACT

A method of connecting a conductive trace to a semiconductor chip includes aligning a conductive pad on the chip with a through-hole in the conductive trace while a base covers the through-hole on a side opposite the chip wherein the conductive trace and the base are different materials, removing some or all of the base thereby exposing the through-hole, and forming a connection joint in the through-hole that electrically connects the conductive trace and the pad. The method may include electroplating the conductive trace onto the base, mechanically attaching the chip to the conductive trace using an adhesive after aligning the pad and the through-hole and before removing some or all of the base, and forming an opening in the adhesive directly beneath the through-hole thereby exposing the pad after removing some or all of the base and before forming the connection joint.

70 Claims, 30 Drawing Sheets

U.S. PATENT DOCUMENTS

| | | | |
|---|---|---|---|
| 5,275,330 A | 1/1994 | Issacs et al. | 228/180.2 |
| 5,284,796 A | 2/1994 | Nakanishi et al. | 437/183 |
| 5,293,067 A | 3/1994 | Thompson et al. | 257/668 |
| 5,294,038 A | 3/1994 | Nakano et al. | 228/179.1 |
| 5,327,010 A | 7/1994 | Uenaka et al. | 257/679 |
| 5,334,804 A | 8/1994 | Love et al. | 174/267 |
| 5,346,750 A | 9/1994 | Hatakeyama et al. | 428/209 |
| 5,355,283 A | 10/1994 | Marrs et al. | 361/760 |
| 5,358,621 A | 10/1994 | Oyama | 205/123 |
| 5,364,004 A | 11/1994 | Davidson | 228/1.1 |
| 5,397,921 A | 3/1995 | Karnezos | 257/779 |
| 5,407,864 A | 4/1995 | Kim | 437/203 |
| 5,424,245 A | 6/1995 | Gurtler et al. | 437/183 |
| 5,438,477 A | 8/1995 | Pasch | 361/689 |
| 5,439,162 A | 8/1995 | George et al. | 228/180.22 |
| 5,447,886 A | 9/1995 | Rai | 437/183 |
| 5,454,161 A | 10/1995 | Beilin et al. | 29/852 |
| 5,454,928 A | 10/1995 | Rogers et al. | 205/125 |
| 5,475,236 A | 12/1995 | Yoshizaki | 257/48 |
| 5,477,933 A | 12/1995 | Nguyen | 174/262 |
| 5,478,007 A | 12/1995 | Marrs | 228/180.22 |
| 5,483,421 A | 1/1996 | Gedney et al. | 361/771 |
| 5,484,647 A | 1/1996 | Nakatani et al. | 428/209 |
| 5,485,949 A | 1/1996 | Tomura et al. | 228/180.5 |
| 5,487,218 A | 1/1996 | Bhatt et al. | 29/852 |
| 5,489,804 A | 2/1996 | Pasch | 257/778 |
| 5,493,096 A | 2/1996 | Koh | 219/121.71 |
| 5,508,229 A | 4/1996 | Baker | 437/183 |
| 5,525,065 A | 6/1996 | Sobhani | 439/67 |
| 5,536,973 A | 7/1996 | Yamaji | 257/737 |
| 5,542,601 A | 8/1996 | Fallon et al. | 228/119 |
| 5,547,740 A | 8/1996 | Higdon et al. | 428/209 |
| 5,556,810 A | 9/1996 | Fujitsu | 437/209 |
| 5,556,814 A | 9/1996 | Inoue et al. | 437/230 |
| 5,564,181 A | 10/1996 | Dineen et al. | 29/841 |
| 5,572,069 A | 11/1996 | Schneider | 257/690 |
| 5,576,052 A | 11/1996 | Arledge et al. | 427/98 |
| 5,583,073 A | 12/1996 | Lin et al. | 439/183 |
| 5,595,943 A | 1/1997 | Itabashi et al. | 437/230 |
| 5,599,744 A | 2/1997 | Koh et al. | 437/195 |
| 5,611,140 A | 3/1997 | Kulesza et al. | 29/832 |
| 5,611,884 A | 3/1997 | Bearinger et al. | 156/325 |
| 5,613,296 A | 3/1997 | Kurino et al. | 29/852 |
| 5,614,114 A | 3/1997 | Owen | 219/121.66 |
| 5,615,477 A | 4/1997 | Sweitzer | 29/840 |
| 5,619,791 A | 4/1997 | Lambrecht, Jr. et al. | 29/852 |
| 5,627,405 A | 5/1997 | Chillara | 257/668 |
| 5,627,406 A | 5/1997 | Pace | 257/700 |
| 5,633,204 A | 5/1997 | Tago et al. | 438/106 |
| 5,637,920 A | 6/1997 | Loo | 257/70 |
| 5,641,113 A | 6/1997 | Somaki et al. | 228/180.22 |
| 5,645,628 A | 7/1997 | Endo et al. | 106/1.23 |
| 5,646,067 A | 7/1997 | Gaul | 437/180 |
| 5,648,686 A | 7/1997 | Hirano et al. | 257/778 |
| 5,654,584 A | 8/1997 | Fujitsu | 257/66 |
| 5,656,858 A | 8/1997 | Kondo et al. | 257/737 |
| 5,663,598 A | 9/1997 | Lake et al. | 257/737 |
| 5,665,652 A | 9/1997 | Shimizu | 438/127 |
| 5,666,008 A | 9/1997 | Tomita et al. | 257/778 |
| 5,669,545 A | 9/1997 | Pham et al. | 228/1.1 |
| 5,674,785 A | 10/1997 | Akram et al. | 437/217 |
| 5,674,787 A | 10/1997 | Zhao et al. | 437/230 |
| 5,682,061 A | 10/1997 | Khandros et al. | 257/666 |
| 5,686,353 A | 11/1997 | Yagi et al. | 437/183 |
| 5,691,041 A | 11/1997 | Frankeny et al. | 428/209 |
| 5,722,162 A | 3/1998 | Chou et al. | 29/852 |
| 5,723,369 A | 3/1998 | Barber | 438/106 |
| 5,731,223 A | 3/1998 | Padmanabhan | 437/183 |
| 5,736,456 A | 4/1998 | Akram | 438/614 |
| 5,739,585 A | 4/1998 | Akram et al. | 257/698 |
| 5,744,859 A | 4/1998 | Ouchida | 257/668 |
| 5,757,071 A | 5/1998 | Bhansali | 257/697 |
| 5,757,081 A | 5/1998 | Chang et al. | 257/778 |
| 5,764,486 A | 6/1998 | Pendse | 361/774 |
| 5,774,340 A | 6/1998 | Chang et al. | 361/771 |
| 5,789,271 A | 8/1998 | Akram | 438/18 |
| 5,798,285 A | 8/1998 | Bentlage et al. | 438/108 |
| 5,801,072 A | 9/1998 | Barber | 438/107 |
| 5,801,447 A | 9/1998 | Hirano et al. | 257/778 |
| 5,803,340 A | 9/1998 | Yeh et al. | 228/56.3 |
| 5,804,771 A | 9/1998 | McMahon et al. | 174/255 |
| 5,808,360 A | 9/1998 | Akram | 257/738 |
| 5,811,879 A | 9/1998 | Akram | 257/723 |
| 5,813,115 A | 9/1998 | Misawa et al. | 29/832 |
| 5,817,541 A | 10/1998 | Averkiou et al. | 438/107 |
| 5,822,856 A | 10/1998 | Bhatt et al. | 29/832 |
| 5,834,844 A | 11/1998 | Akagawa et al. | 257/734 |
| 5,861,666 A | 1/1999 | Bellaar | 257/686 |
| 5,863,816 A | 1/1999 | Cho | 438/123 |
| 5,870,289 A | 2/1999 | Tokuda et al. | 361/779 |
| 5,883,435 A | 3/1999 | Geffken et al. | 257/758 |
| 5,925,931 A | 7/1999 | Yamamoto | 257/737 |
| 5,994,222 A | 11/1999 | Smith et al. | 438/689 |
| 6,012,224 A | 1/2000 | DiStefano et al. | 29/840 |
| 6,013,877 A | 1/2000 | Degani et al. | 174/264 |
| 6,017,812 A | 1/2000 | Yonezawa et al. | 438/613 |
| 6,018,196 A | 1/2000 | Noddin | 257/777 |
| 6,020,561 A | 2/2000 | Ishida et al. | 174/261 |
| 6,037,665 A | 3/2000 | Miyazaki | 257/773 |
| 6,046,909 A | 4/2000 | Joy | 361/748 |
| 6,084,297 A | 6/2000 | Brooks et al. | 257/698 |
| 6,084,781 A | 7/2000 | Klein | 361/771 |
| 6,088,236 A | 7/2000 | Tomura et al. | 361/783 |
| 6,103,552 A | 8/2000 | Lin | 438/113 |
| 6,103,992 A | 8/2000 | Noddin | 219/121.71 |
| 6,127,204 A | 10/2000 | Isaacs et al. | 438/106 |
| 6,159,770 A | 12/2000 | Tetaka et al. | 438/112 |
| 6,350,633 B1 * | 2/2002 | Lin | |

OTHER PUBLICATIONS

Erickson, "Wafer Bumping: The Missing Link for DCA," Electronic Packaging & Production, Jul. 1998, pp. 43–46.

Kuchenmeister et al., "Film Chip Interconnection Systems Prepared By Wet Chemical Metallization," IEEE publication 0–7803–4526–Jun. 1998, 5 pages.

Ghaffarian, "Long Time BGA Assembly Reliability," Advancing Microelectronics, vol. 25, No. 6, Sep./Oct. 1998, pp. 20–23.

U.S. Application Ser. No. 09/465,024, filed Dec. 16, 1999, entitled "Bumpless Flip Chip Assembly With Solder Via".

U.S. Application Ser. No. 09/464,562, filed Dec. 16, 1999, entitled "Bumpless Flip Chip Assembly With Strips And Via–Fill".

U.S. Application Ser. No. 09/464,561, filed Dec. 16, 1999, entitled "Bumpless Flip Chip Assembly With Strips–In–Via And Plating".

U.S. application Ser. No. 09/120,408, filed Jul. 22, 1998, entitled "Flip Chip Assembly With Via Interconnection".

U.S. application Ser. No. 09/643,212, filed Aug. 22, 2000, entitled "Semiconductor Chip Assembly With Simultaneously Electroplated Contact Terminal and Connection Joint".

U.S. application Ser. No. 09/643,214, filed Aug. 22, 2000, entitled "Semiconductor Chip Assembly with Simultaneously Electrolessly Plated Contact Terminal and Connection Joint".

U.S. application Ser. No. 09/643,213, filed Aug. 22, 2000, entitled "Method of Making a Support Circuit for a Semiconductor Chip Assembly".

U.S. application Ser. No. 09/643,445, filed Aug. 22, 2000, entitled "Method of Making a Semiconductor Chip Assembly".

U.S. application Ser. No. 09/665,928, filed Sep. 20, 2000, entitled "Semiconductor Chip Assembly With Ball Bond Connection Joint".

U.S. application Ser. No. 09/665,931, filed Sep. 20, 2000, entitled "Method of Making a Support Circuit With a Tapered Through–Hole for a Semiconductor Chip Assembly".

U.S. application Ser. No. 09/677,207, filed Oct. 2, 2000, entitled "Method of Making a Semiconductor Chip Assembly with a Conductive Trace Subtractively Formed Before and After Chip Attachment".

* cited by examiner

METHOD OF CONNECTING A CONDUCTIVE TRACE TO A SEMICONDUCTOR CHIP

BACKGROUND OF THE INVENTION

1. Field of the Invention

The present invention relates to a semiconductor chip assembly, and more particularly to a method of mechanically and electrically connecting a conductive trace to a semiconductor chip.

2. Description of the Related Art

Semiconductor chips have input/output pads that must be connected to external circuitry in order to function as part of an electronic system. The connection media is typically an array of metallic leads (e.g., a lead frame) or a support circuit (e.g., a substrate), although the connection can be made directly to a circuit panel (e.g., a mother board). Several connection techniques are widely used. These include wire bonding, tape automated bonding (TAB) and flip-chip bonding.

Wire bonding is by far the most common and economical connection technique. In this approach, wires are bonded, one at a time, from the chip to external circuitry by thermocompression, thermosonic or ultrasonic processes. In thermocompression bonding, fine gold wire is fed from a spool through a clamp and a capillary. A thermal source is swept past an end of the wire to form a wire ball that protrudes from the capillary. The chip or capillary is then heated to about 200 to 300° C., the capillary is brought down over an aluminum pad, the capillary exerts pressure on the wire ball, and the wire ball forms a ball bond on the pad. The capillary is then raised and moved to a terminal on the support circuit, the capillary is brought down again, and the combination of force and temperature forms a wedge bond between the wire and the terminal. Thus, the connection between the pad and the terminal includes the ball bond (which only contacts the pad), the wedge bond (which only contacts the terminal) and the wire between the bonds. After raising the capillary again, the wire is ripped from the wedge bond, the thermal source is swept past the wire to form a new wire ball, and the process is repeated for other pads on the chip. Thermosonic bonding is similar to thermocompression bonding but adds ultrasonic vibration as the ball and wedge bonds are formed so that less heat is necessary. Ultrasonic bonding uses aluminum wire to form wedge bonds without applying heat. There are many variations on these basic methods.

TAB involves bonding gold-bumped pads on the chip to external circuitry on a polymer tape using thermocompression bonding. TAB requires mechanical force such as pressure or a burst of ultrasonic vibration and elevated temperature to accomplish metallurgical welding between the wires or bumps and the designated surface.

Flip-chip bonding involves providing pre-formed solder bumps on the pads, flipping the chip so that the pads face down and are aligned with and contact matching bond sites, and melting the solder bumps to wet the pads and the bond sites. After the solder reflows it is cooled down and solidified to form solder joints between the pads and the bond sites. Organic conductive adhesive bumps with conductive fillers in polymer binders have been used in place of solder bumps, but they do not normally form a metallurgical interface in the classical sense. A major advantage of flip-chip bonding over wiring bonding and TAB is that it provides shorter connection paths between the chip and the external circuitry, and therefore has better electrical characteristics such as less inductive noise, cross-talk, propagation delay and waveform distortion. In addition, flip-chip bonding requires minimal mounting area and weight which results in overall cost saving since no extra packaging and less circuit board space are used.

While flip chip technology has tremendous advantages over wire bonding and TAB, its cost and technical limitations are significant. For instance, the cost of forming bumps on the pads is significant. In addition, an adhesive is normally underfilled between the chip and the support circuit to reduce stress on the solder joints due to thermal mismatch between the chip and the support circuit, and the underfilling process increases both manufacturing complexity and cost. Furthermore, the solder joints exhibit increased electrical resistance as well as cracks and voids over time due to fatigue from thermo-mechanical stresses. Finally, the solder is typically a tin-lead alloy and lead-based materials are becoming far less popular due to environmental concerns over disposing of toxic materials and leaching of toxic materials into ground water supplies.

U.S. Pat. No. 4,442,967 discloses a method of providing a raised contact portion on a microcircuit. A wire ball is formed on a wire end by applying thermal energy, the wire ball is pressed against a contact area on the microcircuit using thermocompression or thermosonic wire bonding to form a ball bond, a weakened area of the wire is created near the ball bond, and the wire is severed at the weakened area to provide a raised contact portion on the contact area. The contact portions thus obtained are relatively simple and economical compared to electroplated bumps. However, the contact portions do not yet provide an electrical connection to a support circuit. In order to make this connection, additional process steps are necessary, such as thermocompression bonding the contact portions to TAB inner leads, or disposing a conductive adhesive between the contact portions and bond sites in a flip-chip arrangement.

U.S. Pat. No. 4,661,192 discloses a method of bonding chips to support frames by providing ball bonds on chip pads using wire bonding, planarizing the ball bonds, coating the planarized ball bonds with conductive epoxy, and then registering and bonding the conductive epoxy to corresponding conductive patterns on support frames. Thus, multiple process steps are necessary to electrically connect the chips to the support frames after forming the ball bonds. In addition, care must be taken to ensure that the epoxy does not flow excessively and short the leads.

Conductive adhesives that electrically connect pads on chips to conductive traces on support circuits are well-known in the art. As mentioned above, organic conductive adhesive bumps with conductive fillers in polymer binders have been used, but they do not normally form a metallurgical interface in the classical sense. Moisture penetration through the polymer binder may induce corrosion or oxidation of the conductive filler particles resulting in an unstable electrical connection. Furthermore, the polymer binder and the conductive filler may degrade leading to an unstable electrical connection. Thus, the conductive adhesive may have adequate mechanical strength but poor electrical characteristics.

In view of the various development stages and limitations in currently available semiconductor chip assemblies, there is a need for a semiconductor chip assembly that is cost-effective, reliable, manufacturable, provides excellent mechanical and electrical performance, and complies with stringent environmental standards.

SUMMARY OF THE INVENTION

An object of the present invention is to provide a semiconductor chip assembly with a chip and a conductive trace that provides a low cost, high performance, high reliability package.

Another objective of the present invention is to provide a convenient, costeffective method for manufacturing semiconductor chip assemblies as chip size packages, ball grid arrays or other structures.

In accordance with one aspect of the invention, a method of connecting a conductive trace to a semiconductor chip includes aligning a conductive pad on the chip with a through-hole in the conductive trace while a base covers the through-hole on a side opposite the chip wherein the conductive trace and the base are different materials, removing some or all of the base thereby exposing the through-hole, and forming a connection joint in the through-hole that electrically connects the conductive trace and the pad.

Preferably, the method includes electroplating the conductive trace onto the base, mechanically attaching the chip to the conductive trace using an adhesive after aligning the pad and the through-hole and before removing some or all of the base, and forming an opening in the adhesive directly beneath the through-hole thereby exposing the pad after removing some or all of the base and before forming the connection joint.

The method may also include forming the connection joint by providing a ball bond on the conductive trace and the pad using thermocompression or thermosonic wire bonding.

The method may also include applying a selective etch that removes a portion of the base above the through-hole and forms a pillar in the base that covers and is electrically connected to a portion of the conductive trace, or alternatively, applying a blanket etch that removes all of the base.

The method may further include providing the conductive trace as an inner lead of a TAB lead that fans-out across an outer edge of the chip, or alternatively, as a routing line that fans-in towards the center of the chip.

An advantage of the present invention is that the semiconductor chip assembly need not include solder joints. Another advantage is that the assembly can be manufactured using low temperature processes which reduces stress and improves reliability. A further advantage is that the assembly can be manufactured using well-controlled wet chemical processes which can be easily implemented by circuit board, lead frame and tape manufacturers. Still another advantage is that the assembly can be manufactured using materials that are compatible with copper chip and lead-free environmental requirements.

These and other objects, features and advantages of the invention will be further described and more readily apparent from a review of the detailed description of the preferred embodiments which follows.

BRIEF DESCRIPTION OF THE DRAWINGS

The following detailed description of the preferred embodiments can best be understood when read in conjunction with the following drawings, in which.

DETAILED DESCRIPTION OF THE PREFERRED EMBODIMENTS

FIGS. 1A–1K, 2A–2K and 3A–3K are cross-sectional, top and bottom views, respectively, of a method of connecting a conductive trace to a semiconductor chip in accordance with an embodiment of the present invention. In this embodiment, the chip is singulated from other chips on a wafer before the conductive trace is connected to it, and the conductive trace is an inner lead of a TAB lead that extends across an outer edge of the chip and provides fan-out routing for the chip.

Figure 1A:
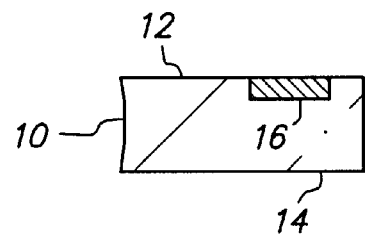
FIGS. 1A–1K are cross-sectional views showing a method of connecting a conductive trace to a semiconductor chip in accordance with an embodiment of the present invention.
Figure 2A:
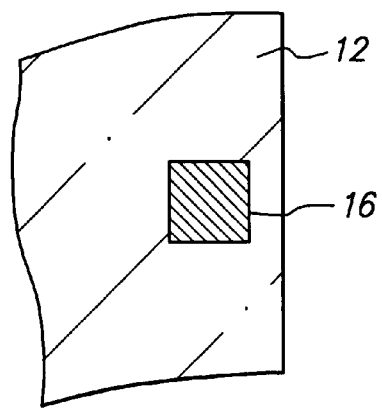
FIGS. 2A–2K are top plan views corresponding to FIGS. 1A–1K, respectively.
Figure 3A:
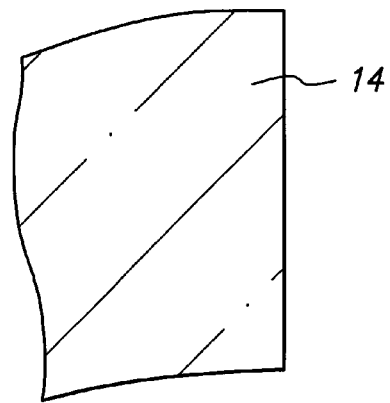
FIGS. 3A–3K are bottom plan views corresponding to FIGS. 1A–1K, respectively.

FIGS. 1A, 2A and 3A are cross-sectional, top and bottom views, respectively, of semiconductor chip 10 which is an integrated circuit in which various transistors, circuits, interconnect lines and the like are formed (not shown). Chip 10 includes upper surface 12 and lower surface 14. Upper surface 12 includes conductive pad 16. Pad 16 is substantially aligned with the insulative housing of chip 10 so that upper surface 12 is essentially flat. Alternatively, if desired, pad 16 can extend above or be recessed below the insulative housing. Pad 16 provides a bonding site to electrically couple chip 10 with external circuitry. Thus, pad 16 can be an input/output pad or a power/ground pad. Pad 16 can have an aluminum base that serves as a surface layer, or alternatively, an aluminum base covered by a surface layer such as gold with an adhesion and/or barrier layer therebetween, depending on the nature of a connection joint that shall subsequently contact the pad. If desired, the aluminum base of pad 16 is cleaned by dipping chip 10 in a solution containing 0.05 M phosphoric acid at room temperature for 1 minute and then rinsed in distilled water before depositing the next layer on the aluminum base. Pad 16 has a length and width of 70 microns. Chip 10 includes many other pads on upper surface 12, and only pad 16 is shown for convenience of illustration. In addition, chip 10 has already been singulated from other chips that it was previously attached to on a wafer.

Figure 1B:
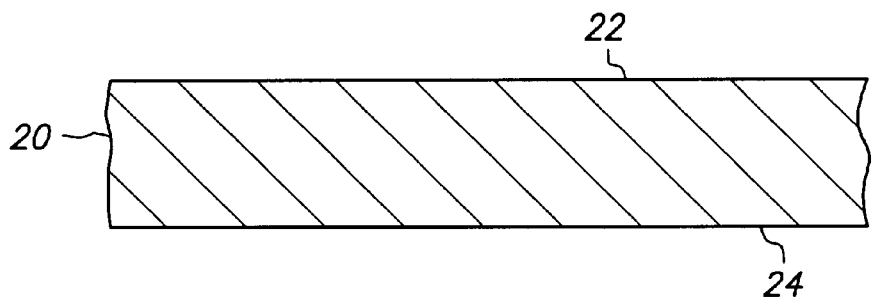
Figure 2B:
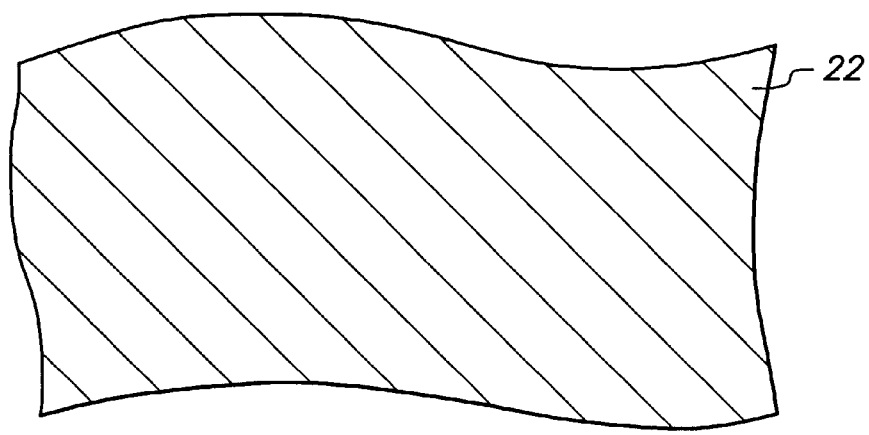
Figure 3B:
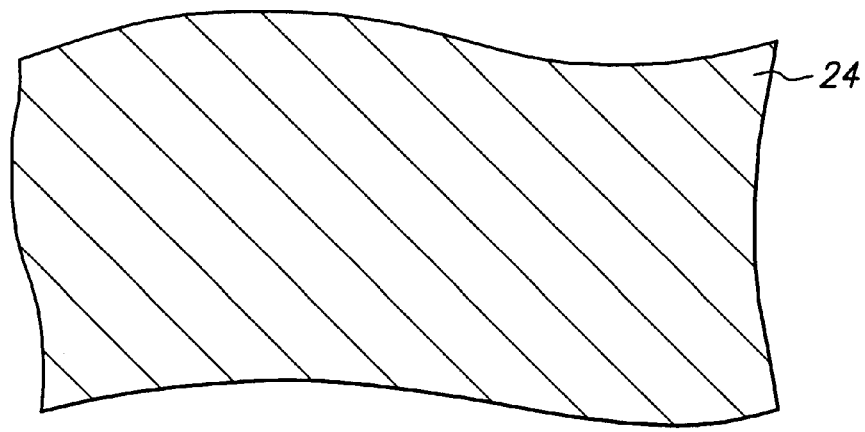

FIGS. 1B, 2B and 3B are cross-sectional, top and bottom views, respectively, of base 20 which includes top surface 22 and bottom surface 24. Base 20 is a copper foil with a thickness of 100 microns.

Figure 1C:
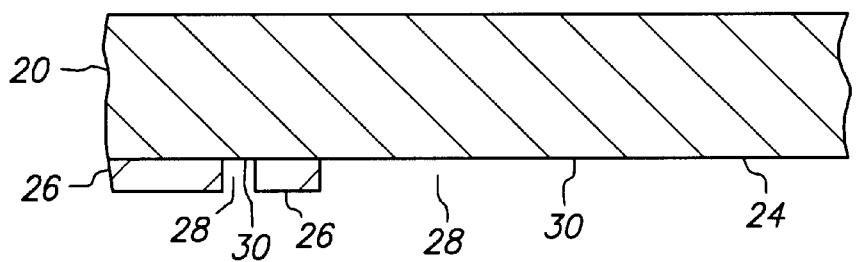
Figure 2C:
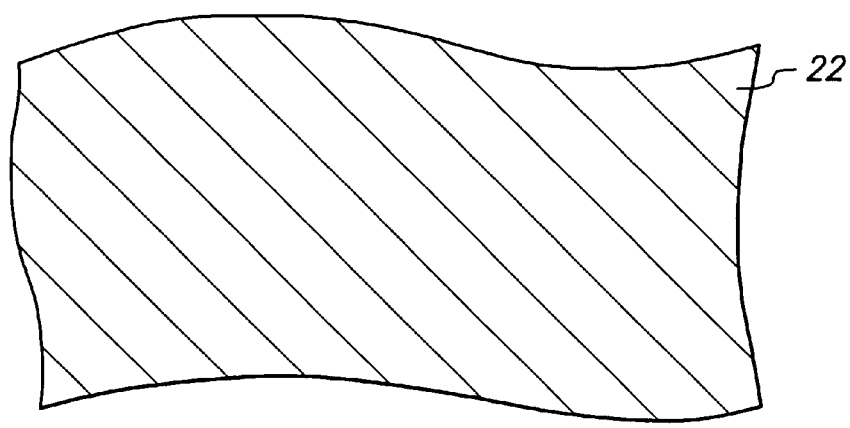
Figure 3C:
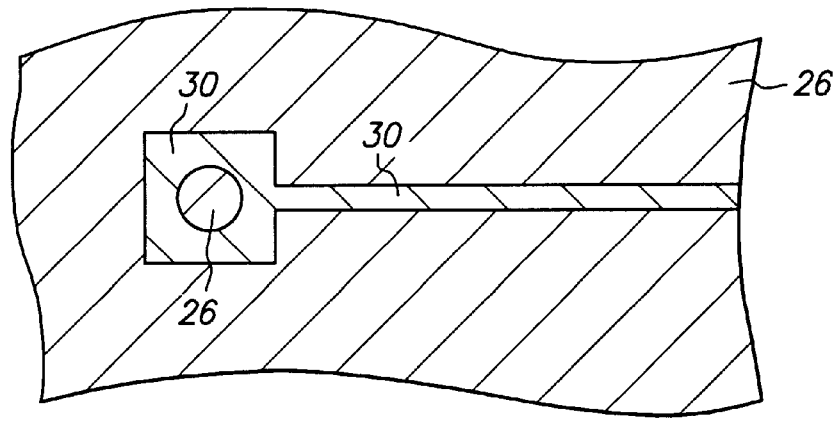

FIGS. 1C, 2C and 3C are cross-sectional, top and bottom views, respectively, of photoresist layer 26 formed on bottom surface 24 of base 20. Photoresist layer 26 is deposited as a continuous layer and then patterned by selectively applying light through a reticle (not shown), applying a developer solution to remove the photoresist portions rendered soluble by the light, and then hard baking, as is conventional. As a result, photoresist layer 26 contains opening 28 that selectively exposes portion 30 of bottom surface 24. Photoresist layer 26 has a thickness of 10 microns.

Figure 1D:
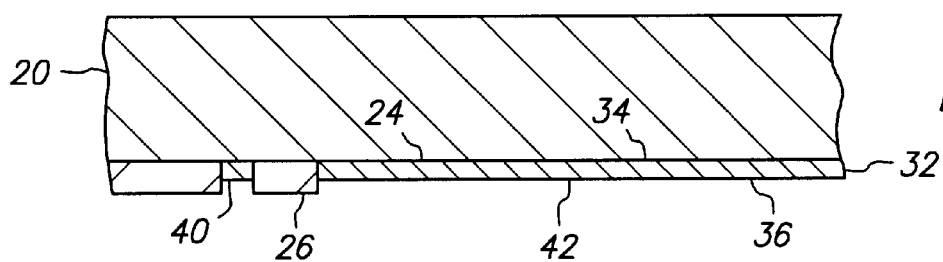
Figure 2D:
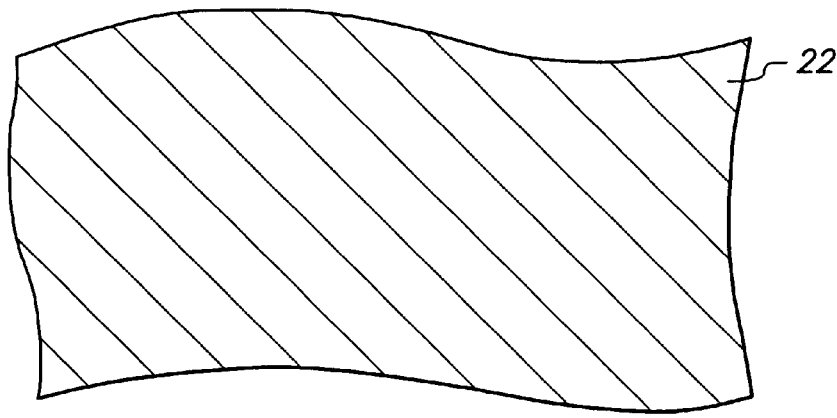
Figure 3D:
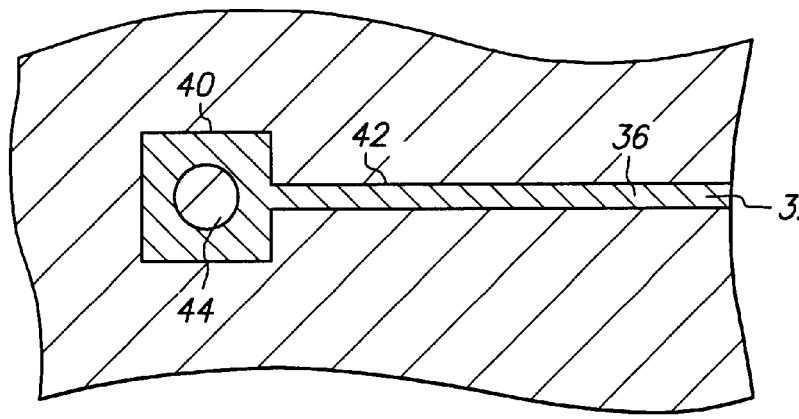

FIGS. 1D, 2D and 3D are cross-sectional, top and bottom views, respectively, of conductive trace 32 formed on base 20. Conductive trace 32 includes top surface 34, bottom surface 36, enlarged rectangular portion 40 and routing portion 42. Conductive trace 32 also includes through-hole 44 that extends between top surface 34 and bottom surface 36 and is centered within and surrounded by enlarged rectangular portion 40. Top surface 34 contacts and is covered by bottom surface 24 of base 20. Likewise, through-hole 44 is covered by bottom surface 24. Bottom surface 36 is exposed, and through-hole 44 is filled by photoresist layer 26. Conductive trace 32 is composed of gold and has a thickness of 5 microns, enlarged rectangular portion 40 has a length and width of 100 microns, routing portion 42 has a width of 20 microns, and through-hole 44 has a diameter of 60 microns.

Conductive trace 32 is formed by an electroplating operation. Thus, conductive trace 32 is formed additively. Initially, a plating bus (not shown) is connected to base 20, current is applied to the plating bus from an external power source, and base 20 is submerged in an electrolytic gold plating bath such as Technic Orotemp at room temperature. As a result, conductive trace 32 electroplates (or grows) on exposed portion 30 of bottom surface 24 of base 20. The electroplating operation continues until conductive trace 32 has the desired thickness. Thereafter, the structure is removed from the electrolytic bath and rinsed in distilled water to remove contaminants.

Figure 1E:
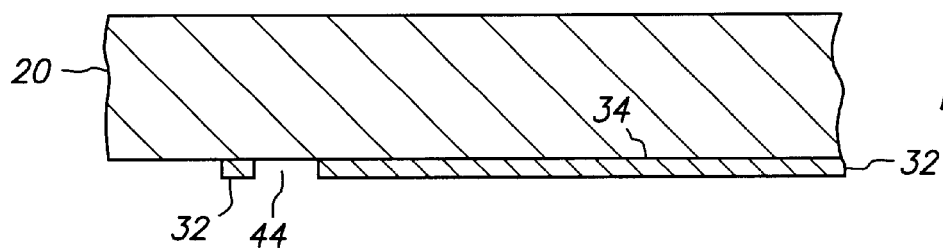
Figure 2E:
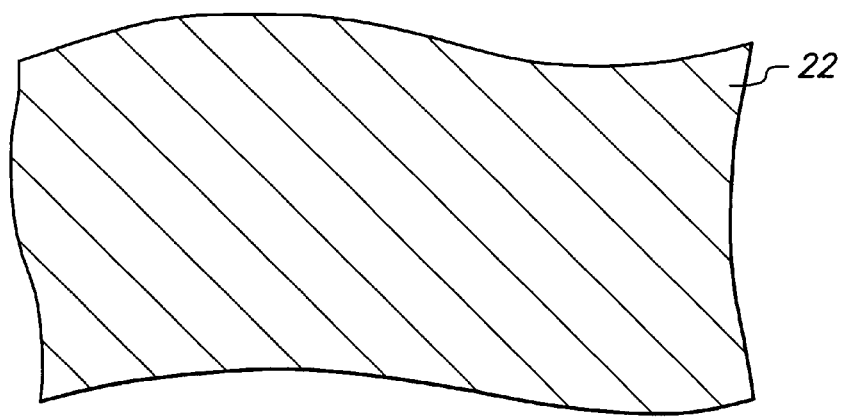
Figure 3E:
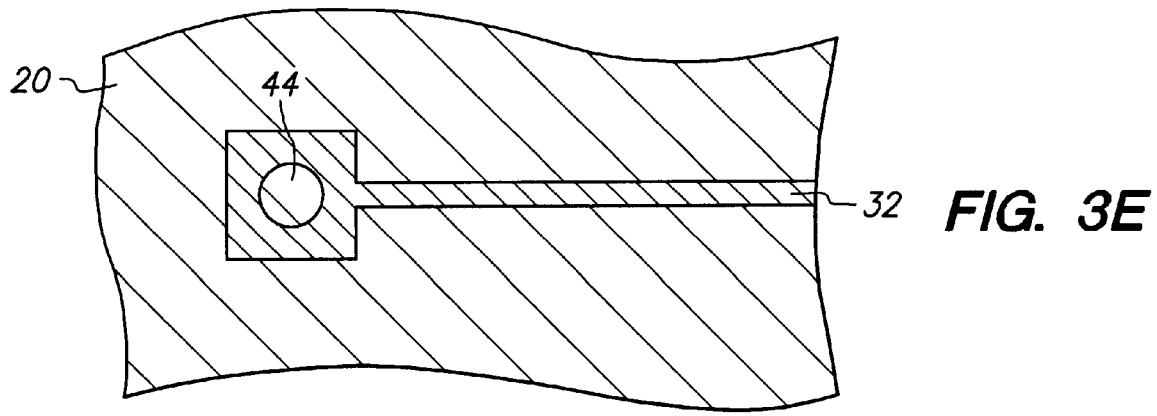

FIGS. 1E, 2E and 3E are cross-sectional, top and bottom views, respectively, of base 20 and conductive trace 32 after photoresist layer 26 is stripped. At this stage, the outer edges of conductive trace 32 and the sidewalls of through-hole 44 are exposed, however conductive trace 32 remains attached to base 20, and top surface 34 and through-hole 44 remain covered by base 20.

Figure 1F:
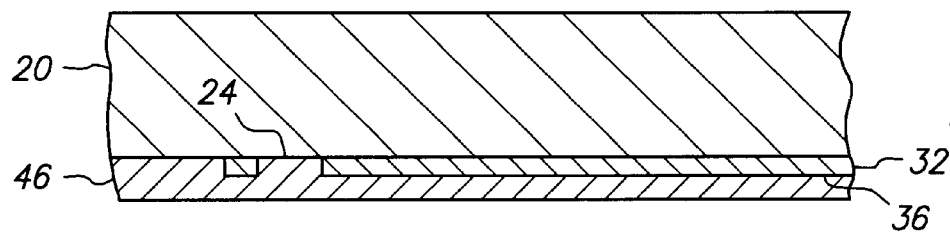
Figure 2F:
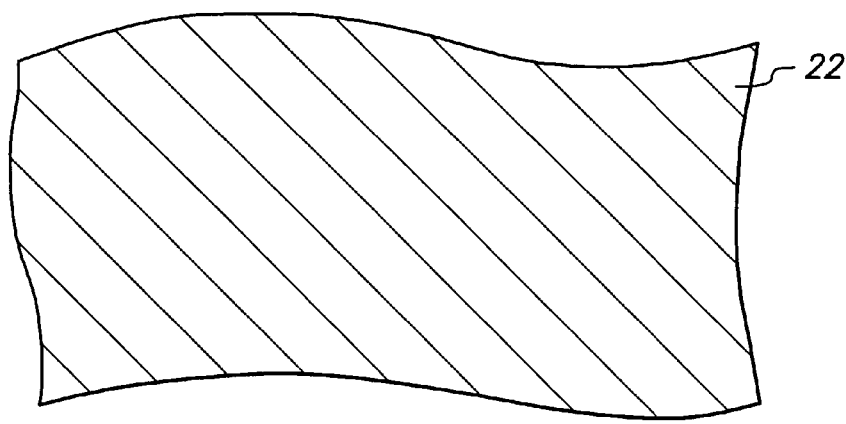
Figure 3F:
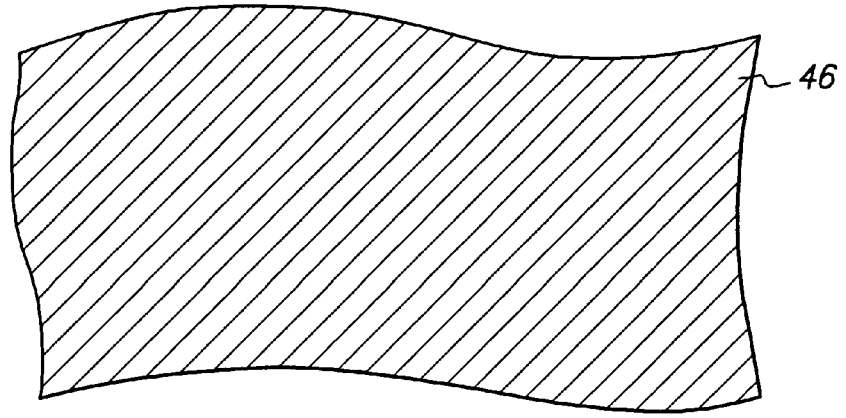

FIGS. 1F, 2F and 3F are cross-sectional, top and bottom views, respectively, of adhesive 46 attached to base 20 and conductive trace 32. Adhesive 46 is a thermoplastic polyimide film with a glass transition temperature (Tg) of 400° C. Adhesive 46 is applied to bottom surface 36 of conductive trace 32 as a liquid resin such as polyamic acid using stencil printing. The liquid resin flows over the outer edges of conductive trace 32 and into through-hole 44. As a result, the liquid resin covers the exposed surfaces of conductive trace 32 and the exposed portions of bottom surface 24 of base 20 outside conductive trace 32 and within through-hole 44. Thereafter, the liquid resin is cured to form adhesive 46 as a polyimide film that extends 30 microns beneath bottom surface 24 and 25 microns beneath bottom surface 36.

Figure 1G:
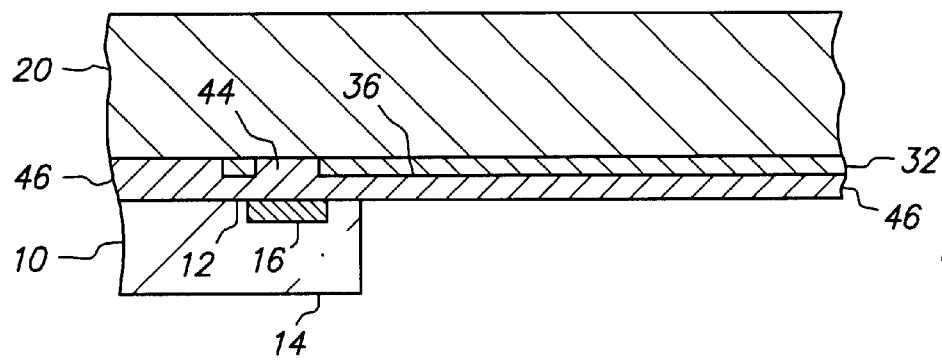
Figure 2G:
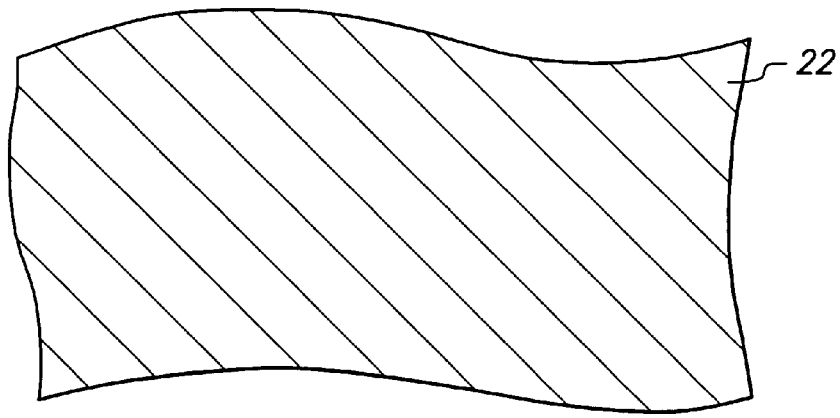
Figure 3G:
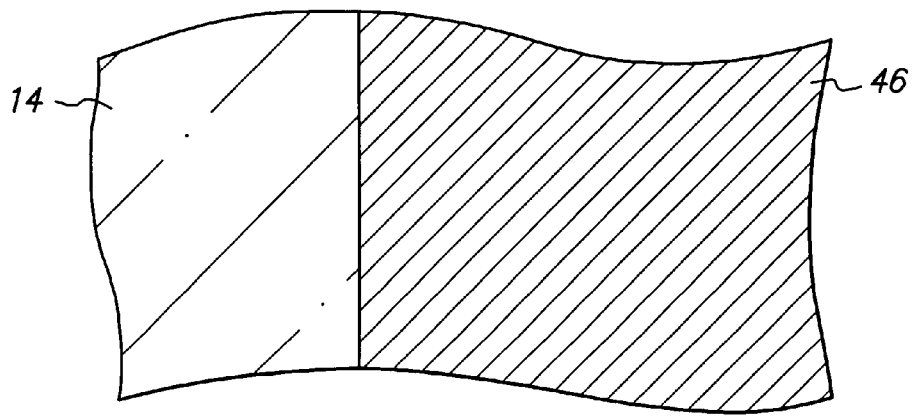

FIGS. 1G, 2G and 3G are cross-sectional, top and bottom views, respectively, of chip 10 mechanically attached to conductive trace 32 by adhesive 46. Adhesive 46 is disposed between and contacts upper surface 12 of chip 10 and bottom surface 36 of conductive trace 32. Thus, chip 10 and conductive trace 32 do not contact one another. Preferably, adhesive 46 is sandwiched between upper surface 12 and bottom surface 36 using relatively low pressure while adhesive 46 is heated to its glass transition temperature and becomes molten. In addition, chip 10 and conductive trace 32 are positioned relative to one another so that pad 16 is aligned with through-hole 44. That is, at least a portion of pad 16, and preferably a majority of pad 16, is directly beneath through-hole 44. Since the 70 micron length and width of pad 16 exceed the 60 micron diameter of through-hole 44, all of pad 16 cannot be directly beneath through-hole 44. Instead, a central portion of pad 16 is directly beneath through-hole 44 and a peripheral portion of pad 16 is outside through-hole 44. Pad 16 and through-hole 44 can be aligned using an automated pattern recognition system. Thereafter, adhesive 46 is cooled and solidifies to form a solid adhesive layer that is 25 microns thick between upper surface 12 and bottom surface 36 and mechanically fastens chip 10 to conductive trace 32. At this stage, through-hole 44 is covered from above by base 20 and filled with and covered from below by adhesive 46, pad 16 is covered from above by adhesive 46, and pad 16 is separated from conductive trace 32 by the thickness of adhesive 46.

Figure 1H:
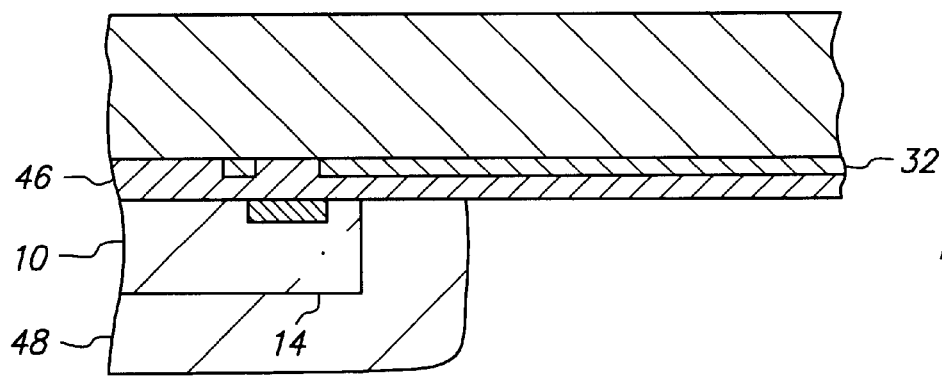
Figure 2H:
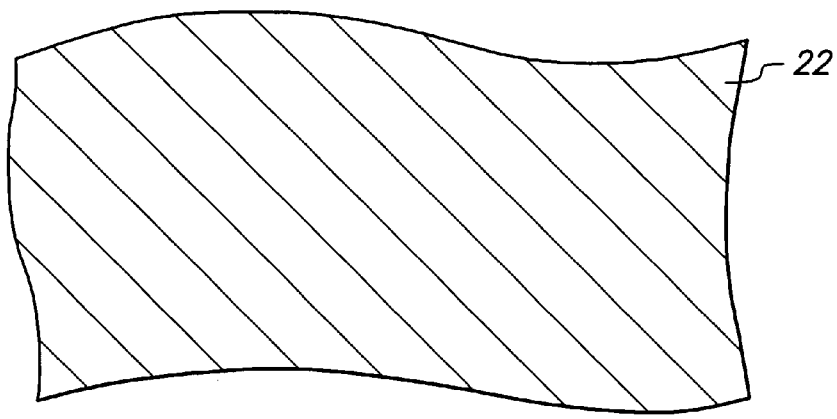
Figure 3H:
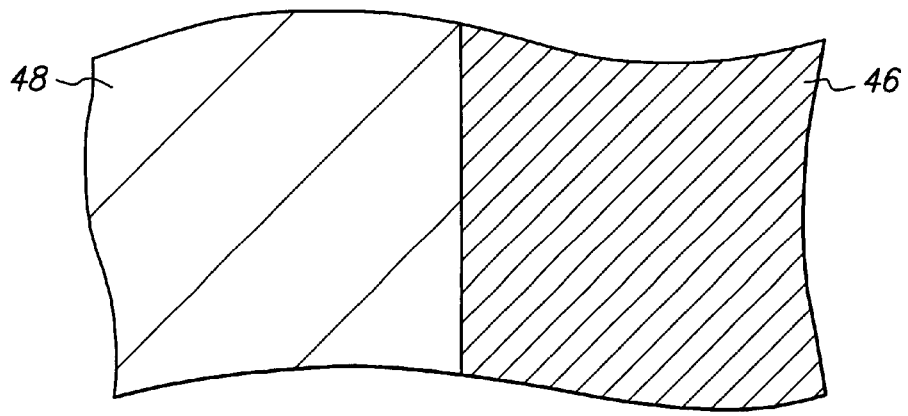

FIGS. 1H, 2H and 3H are cross-sectional, top and bottom views, respectively, of encapsulant 48 formed on lower surface 14 of chip 10. Preferably, encapsulant 48 is initially an epoxy in paste form that includes an epoxy resin, a curing agent, an accelerator and a filler. The filler is an inert material such as silica (powdered fused quartz) that provides thermal coefficient of expansion matching. The epoxy paste is coated onto the outer edges (one shown) and lower surface 14 of chip 10 as well as the surface of adhesive 46 opposite to conductive trace 32 and outside chip 10. Thereafter, the epoxy paste is cured or hardened at relatively low temperature in the range of 100–250° C. to form a solid adherent protective layer. Encapsulant 48 provides back-side environmental protection such as moisture resistance and particle protection for chip 10 and has a thickness of 100 microns.

Figure 1I:
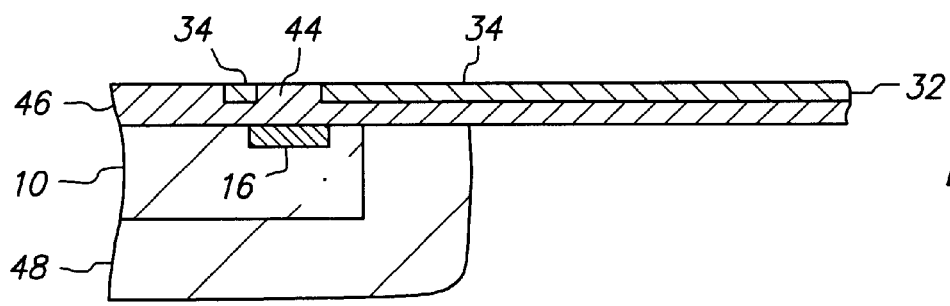
Figure 2I:
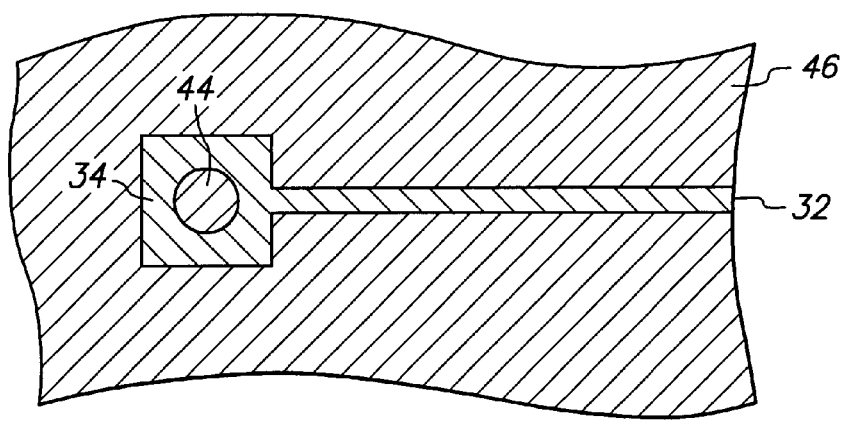
Figure 3I:
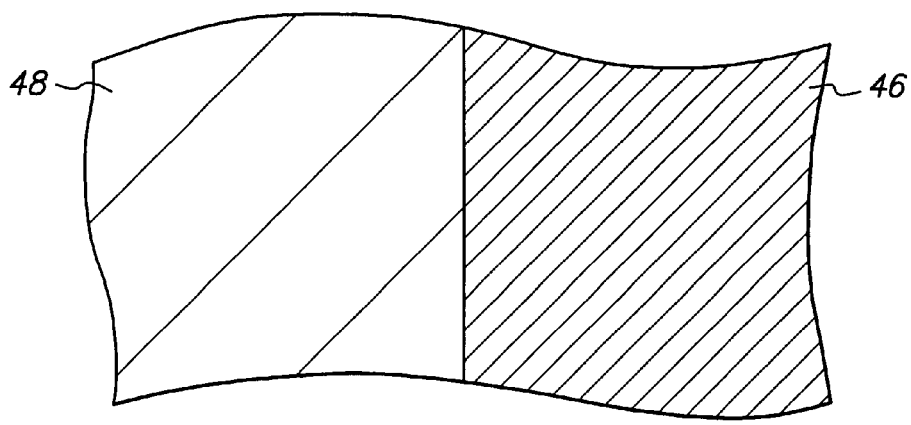

FIGS. 1I, 2I and 3I are cross-sectional, top and bottom views, respectively, of chip 10 and conductive trace 32 after base 20 is removed. A "front-side" wet chemical etch is applied to top surface 22 of base 20. For instance, the wet chemical etch can be sprayed on top surface 22, or the structure can be dipped in the wet chemical etch since chip 10 is protected by encapsulant 48. The wet chemical etch is highly selective of copper with respect to gold, polyimide and epoxy. Therefore, no appreciable amount of conductive trace 32, adhesive 46 or encapsulant 48 is removed. A suitable wet chemical etch can be provided by a solution containing alkaline ammonia, sulfuric acid with hydrogen peroxide, chromic-sulfuric acid, phosphoric acid with ammonium persulfate, copper sulfate, copper chloride or ferric chloride. The optimal etch time for exposing base 20 to the wet chemical etch in order to completely remove base 20 without excessively exposing conductive trace 32 to the wet chemical etch can be established through trial and error. Advantageously, since the wet chemical etch is not selective of gold, there is a wide window of acceptable etch times and little or no endpoint concern.

The wet chemical etch completely removes base 20. As a result, the entire top surface 34 of conductive trace 32 is exposed, and likewise, through-hole 44 is exposed. At this stage, adhesive 46 continues to cover pad 16, fill through-hole 44, and provides critical mechanical support for conductive trace 32 which would otherwise be a dangling lead.

Figure 1J:
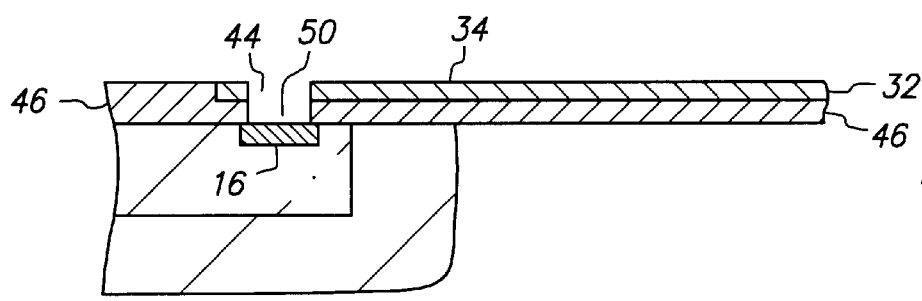
Figure 2J:
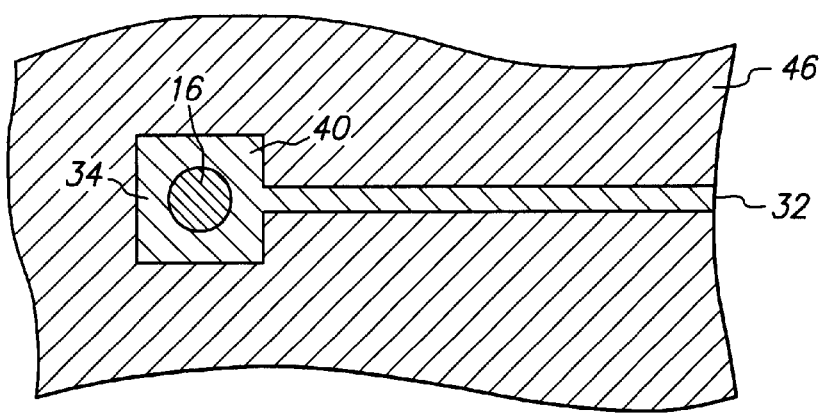
Figure 3J:
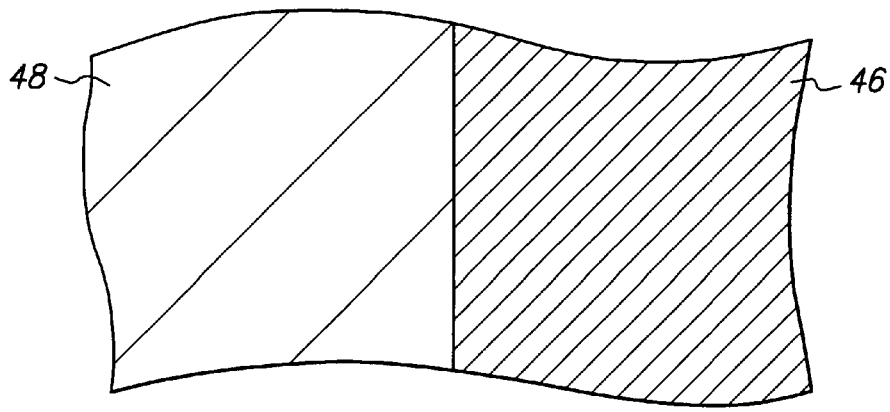

FIGS. 1J, 2J and 3J are cross-sectional, top and bottom views, respectively, of opening 50 formed in adhesive 46. In particular, any adhesive 46 in through-hole 44 is removed, and a portion of adhesive 46 directly below through-hole 44 is also removed to form opening 50 in adhesive 46. As a result, through-hole 44 and opening 50 extend through conductive trace 32 and adhesive 46, respectively, and expose pad 16. Opening 50 can be provided by applying a suitable etch that is highly selective of adhesive 46 with respect to pad 16 and conductive trace 32. The preferred etch depends on the thickness of adhesive 46.

In this instance, a selective laser etch is applied. Using projection laser ablation, a metal mask (not shown) is positioned above top surface 34 such that an opening in the metal mask is aligned with through-hole 44, and a laser is directed to the side of the metal mask opposite top surface 34. Accordingly, the metal mask targets the laser at through-hole 44. After the laser removes whatever adhesive 46 is inside or directly below through-hole 44, the laser strikes pad 16. In addition, the laser strikes a portion of the top surface of enlarged rectangular portion 40 adjacent to through-hole 44 due to registration and alignment inaccuracies. However, the laser does not strike the peripheral edges of enlarged rectangular portion 40 or outside enlarged rectangular portion 40, nor does the laser deform or remove an appreciable amount of pad 16 or enlarged rectangular portion 40. Instead, pad 16 and enlarged rectangular portion 40 provide an etch stop for the laser. As a result, the laser essentially provides an extension or pattern transfer of through-hole 44 through adhesive 46. Through-hole 44 and opening 50 each have 60 micron diameters, are axially aligned with one another, and together expose pad 16.

Figure 1K:
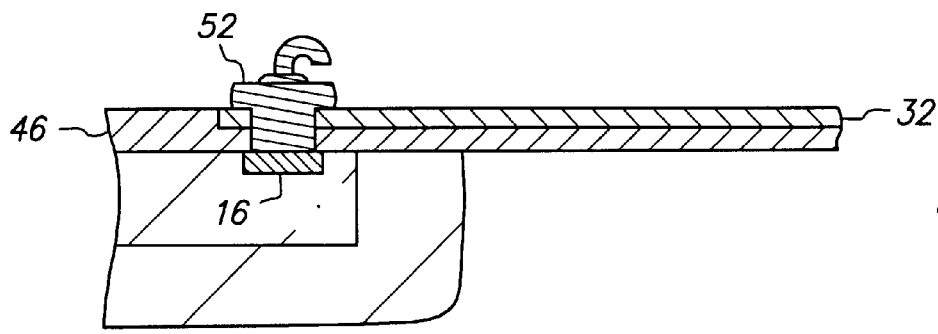
Figure 2K:
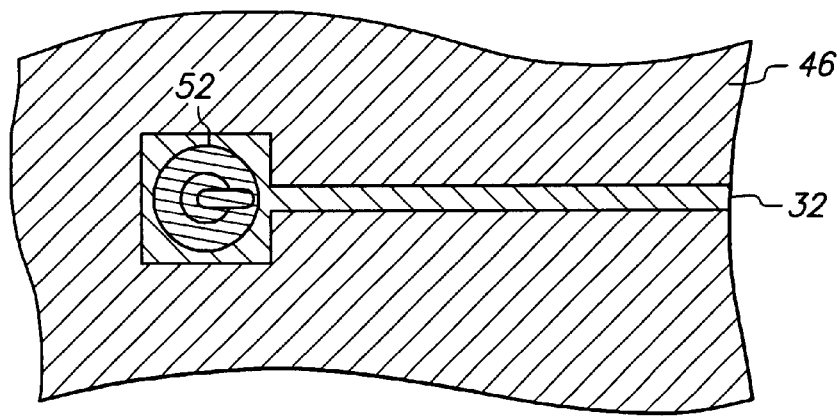
Figure 3K:
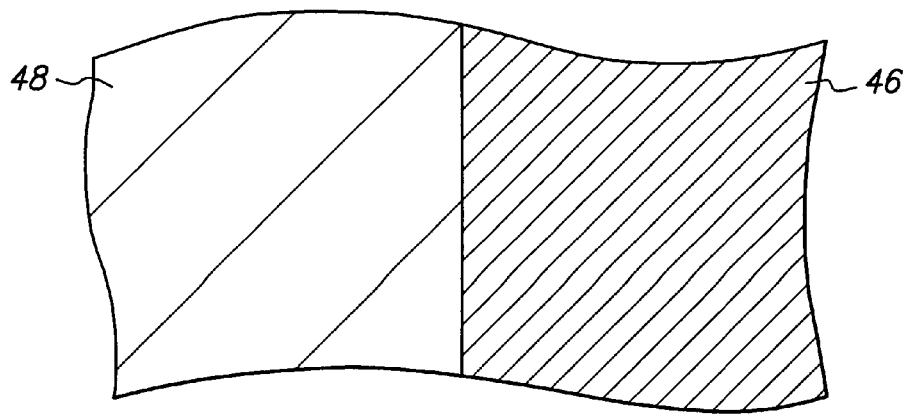

FIGS. 1K, 2K and 3K are cross-sectional, top and bottom views, respectively, of the fully completed assembly after connection joint 52 is formed. Connection joint 52 is formed in through-hole 44, extends through opening 50 in adhesive 46, and contacts pad 16 and conductive trace 32, thereby electrically connecting pad 16 and conductive trace 32. In particular, connection joint 52 contacts the central portion of pad 16 directly beneath through-hole 44, the sidewalls of opening 50, the sidewalls of through-hole 44, and a portion of the top surface of enlarged rectangular portion 40 of conductive trace 32 that is adjacent to through-hole 44. Moreover, connection joint 52 only contacts pad 16, conductive trace 32 and adhesive 46, is the only conductor in through-hole 44, and has an exposed top surface. Connection joint 52 is a gold ball bond formed by thermosonic wire bonding, although thermocompression wire bonding can also be used. Connection joint 52 provides a robust, permanent electrical connection between pad 16 and conductive trace 32.

FIGS. 4A–4E are enlarged cross-sectional views showing a method of making connection joint 52.

Figure 4A:
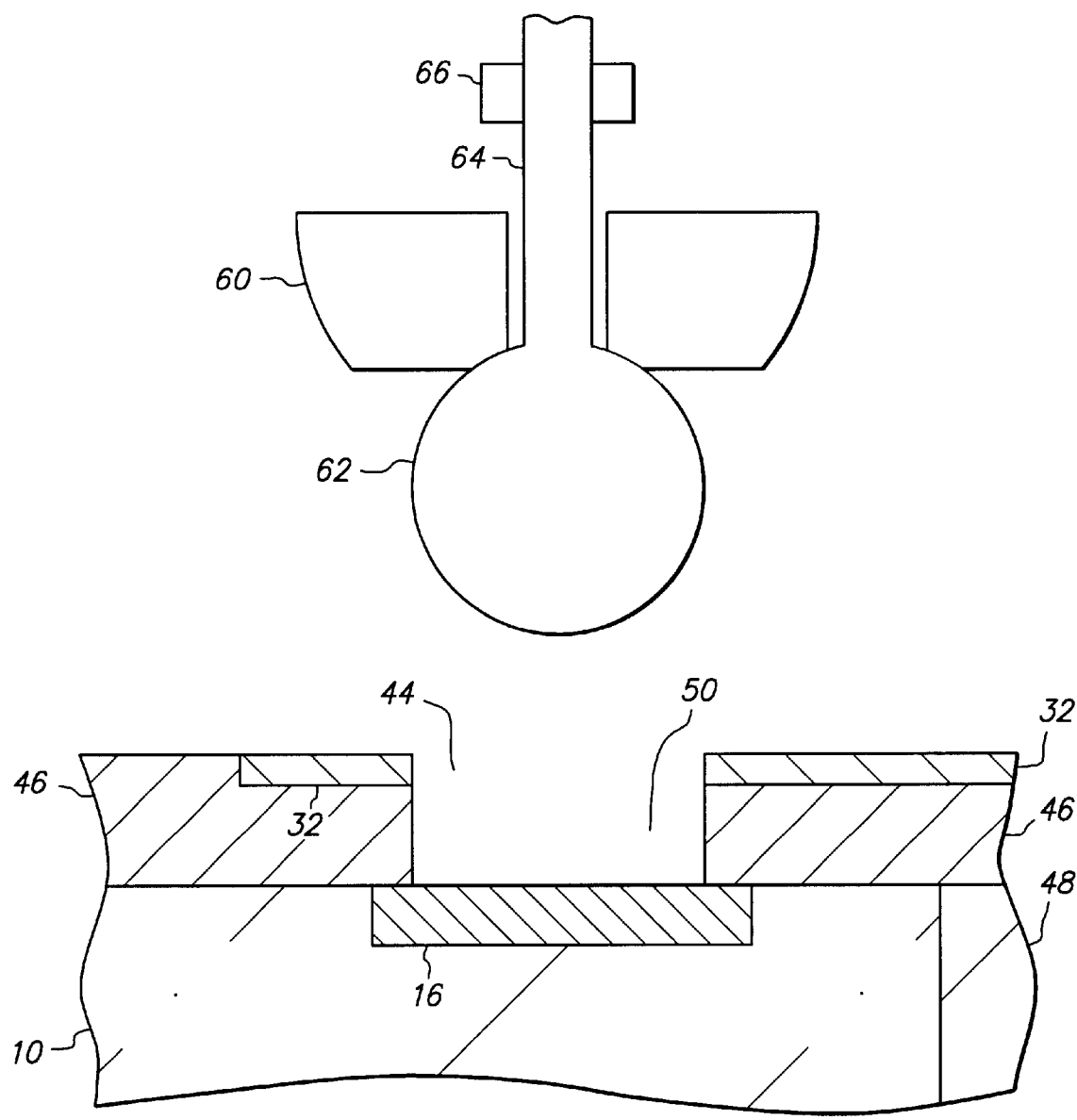
FIGS. 4A–4E are enlarged cross-sectional views showing a method of making the connection joint in FIG. 1K.

FIG. 4A shows the partially completed assembly after capillary 60 and wire ball 62 are positioned above through-hole 44. Capillary 60 is part of a conventional thermosonic wire bonding apparatus. Capillary 60 has a conical shape and can be composed of alumina, tungsten carbide, ceramic, artificial ruby or various refractory metals. Wire ball 62 is composed of gold and protrudes from the bottom of capillary 60. Wire ball 62 is formed at the end of gold wire 64 by applying thermal energy, such as electronic flame-off or a hydrogen gas flame jet, as is conventional. Wire 64 is fed from a spool (not shown) through clamp 66 and a bore in capillary 60. Clamp 66 is closed to hold wire 64 in place. Wire ball 62 has a diameter of 60 microns, and wire 64 has a diameter of 25 microns. Wire ball 62 is suitably sized so that the subsequently connection joint 52 fills through-hole 44 and opening 50. This can be determined through arithmetic calculations.

Figure 4B:
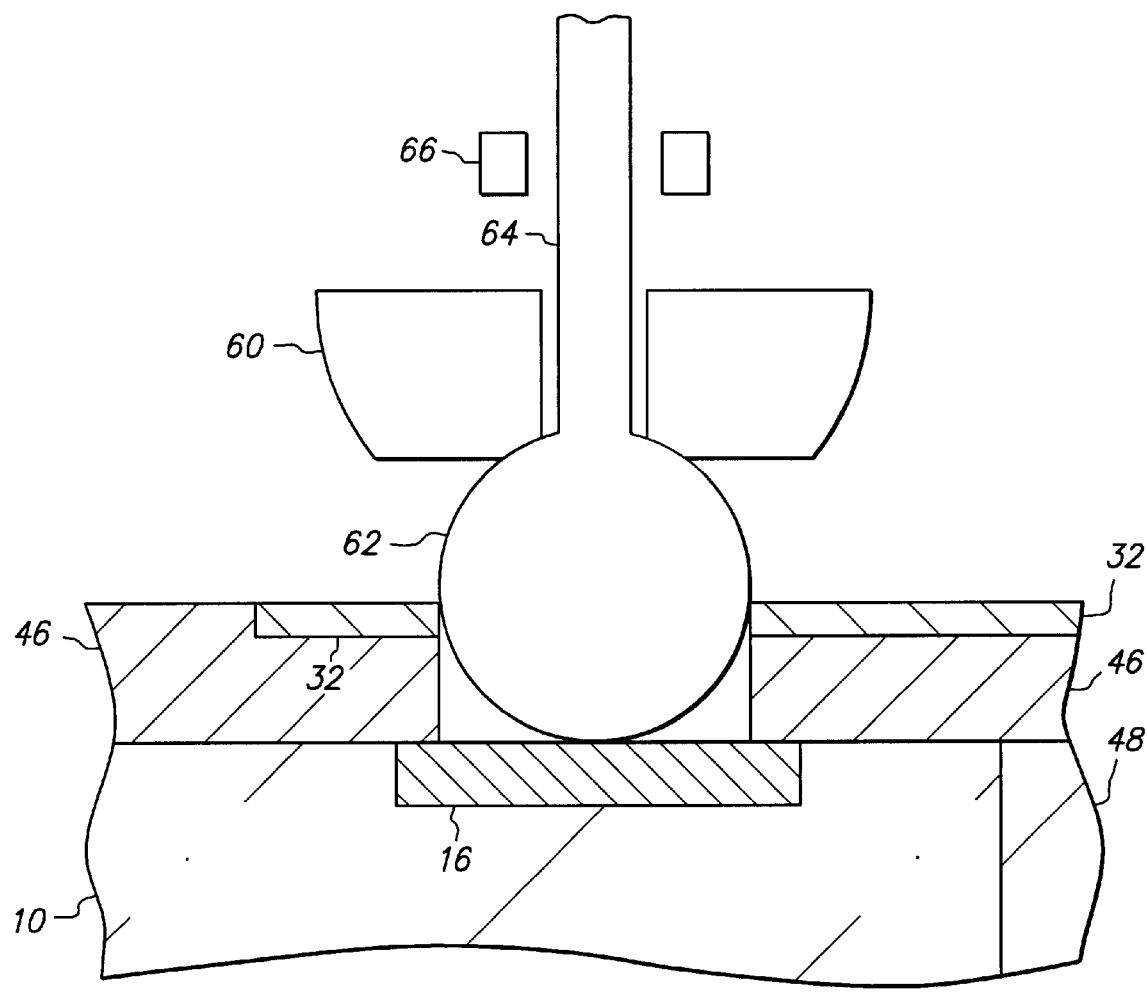

FIG. 4B shows the partially completed assembly after capillary 60 moves downward towards pad 16 such that wire ball 62 enters through-hole 44 and opening 50 and contacts pad 16 and conductive trace 32. Clamp 66 opens before the movement begins so that wire 64 unwinds from its spool as capillary 60 moves. In addition, capillary 60 is heated to about 150 to 200° C. and provides horizontal ultrasonic oscillatory motions with a frequency of about 60 to 120 kHz. The combination of heat from capillary 60 and the recent flaming operation place wire ball 62 in a soft state which is easy to deform. However, the temperature of wire ball 62 does not reach the glass transition temperature of adhesive 46 which remains a solid adhesive film.

Figure 4C:
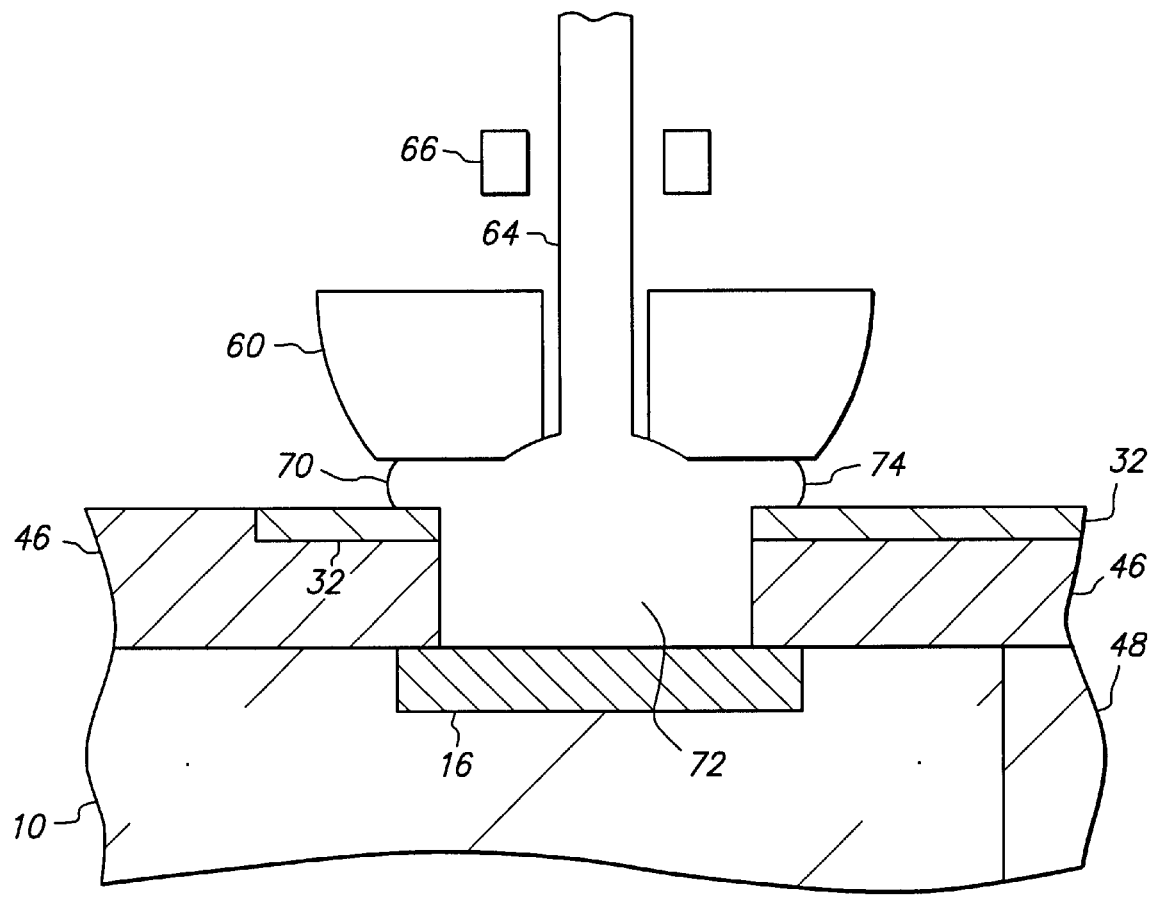

FIG. 4C shows the partially completed assembly after capillary 60 moves further downward towards pad 16 such that wire ball 62 deforms into mushroom-shaped ball bond 70 that fills through-hole 44 and opening 50. More particularly, since wire ball 62 is still in a soft state which is easy to deform, and capillary 60 exerts a downward force of about 25 to 45 grams while continuing to oscillate ultrasonically, wire ball 62 squeezes into through-hole 44 and opening 50 and deforms into mushroom-shaped ball bond 70 that includes stem 72 and pileus or cap 74. Stem 72 fills through-hole 44 and opening 50 and contacts pad 16 and the sidewalls of through-hole 44 and opening 50. Cap 74 extends above conductive trace 32 and contacts a portion of the top surface of enlarged rectangular portion 40 that is adjacent to through-hole 44 without contacting the peripheral edges of enlarged rectangular portion 40 and without contacting routing portion 42 of conductive trace 32. Clamp 66 remains open so that wire 64 continues to unwind from its spool as capillary 60 moves. Furthermore, the combination of heat, pressure and ultrasonic vibration forms a gold-aluminum alloy between ball bond 70 and pad 16 and a fused gold joint between ball bond 70 and conductive trace 32.

Figure 4D:
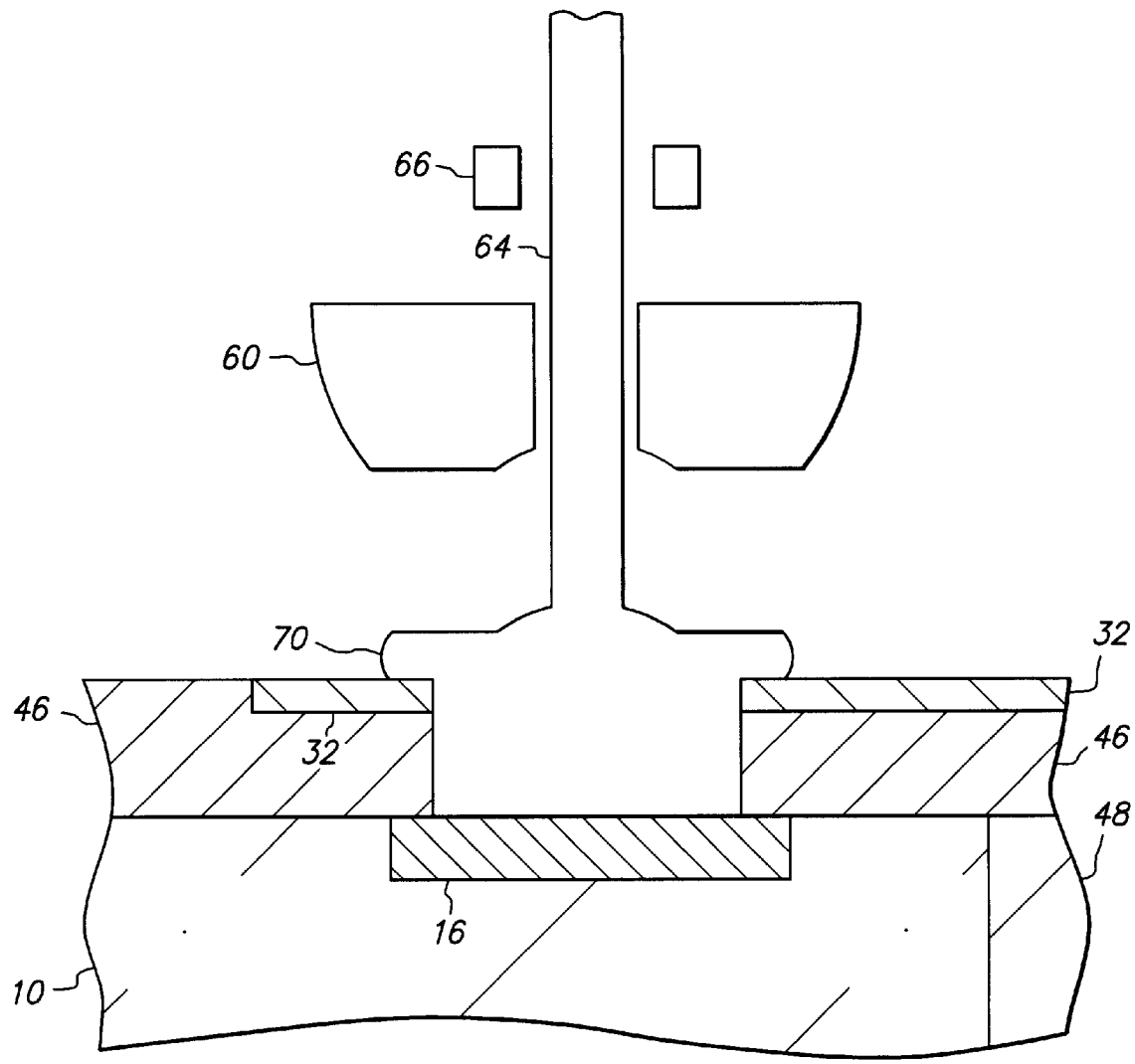

FIG. 4D shows the partially completed assembly after capillary 60 moves upward away from pad 16 and mushroom-shaped ball bond 70 while clamp 66 remains open and wire 64 slides through capillary 60 without exerting upward pressure on ball bond 70. In addition, ball bond 70 begins to cool and solidify.

Figure 4E:
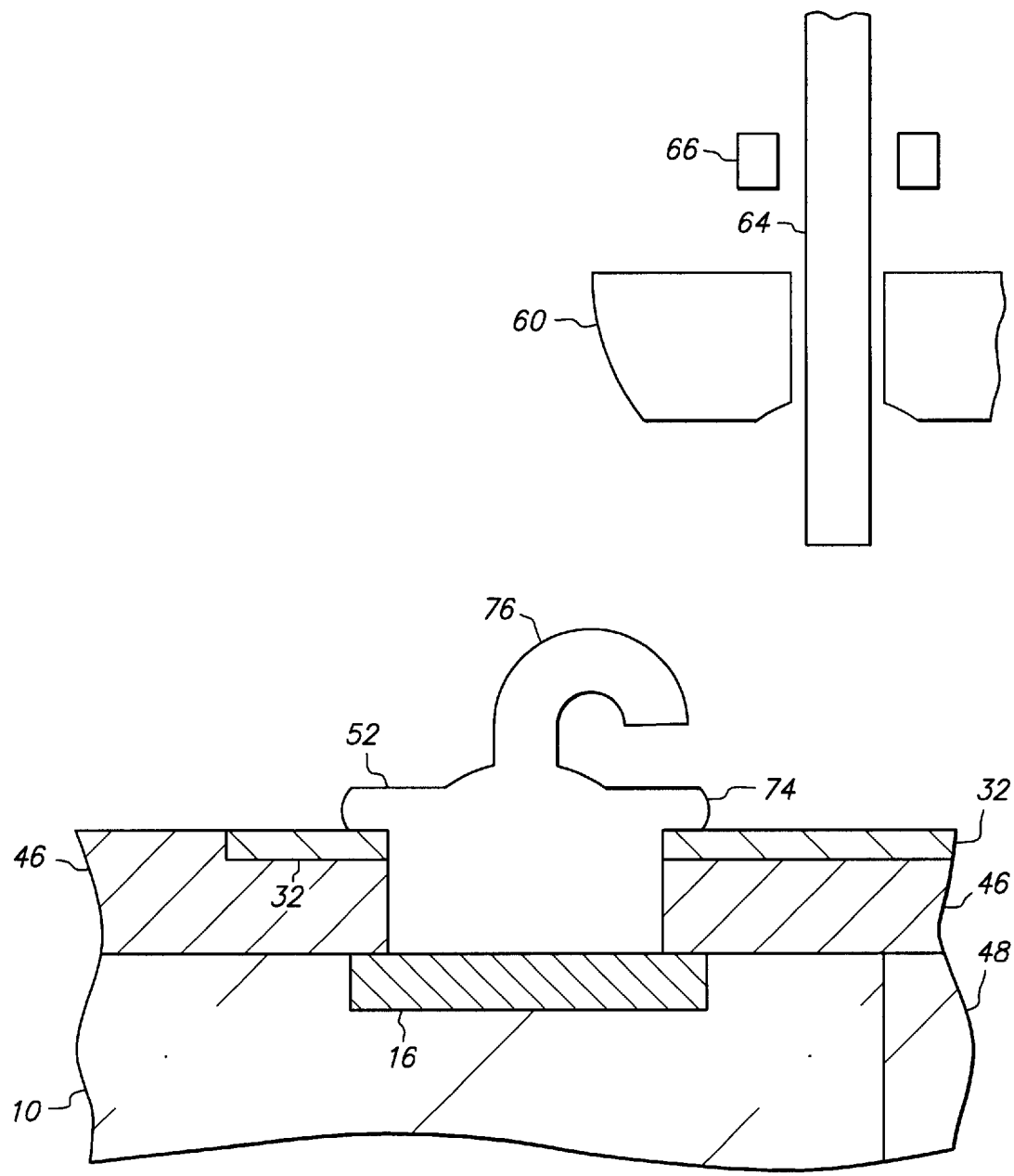
Figure 6A:
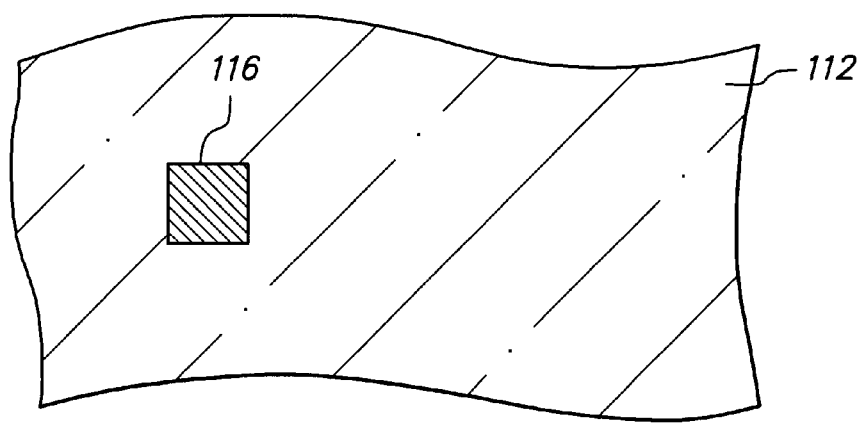
FIGS. 6A–6N are top plan views corresponding to FIGS. 5A–5N, respectively.
Figure 7A:
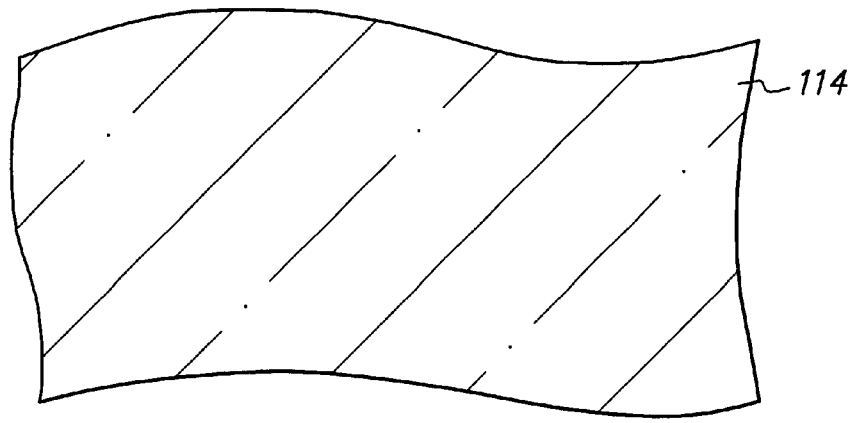
FIGS. 7A–7N are bottom plan views corresponding to FIGS. 5A–5N, respectively.
Figure 6B:
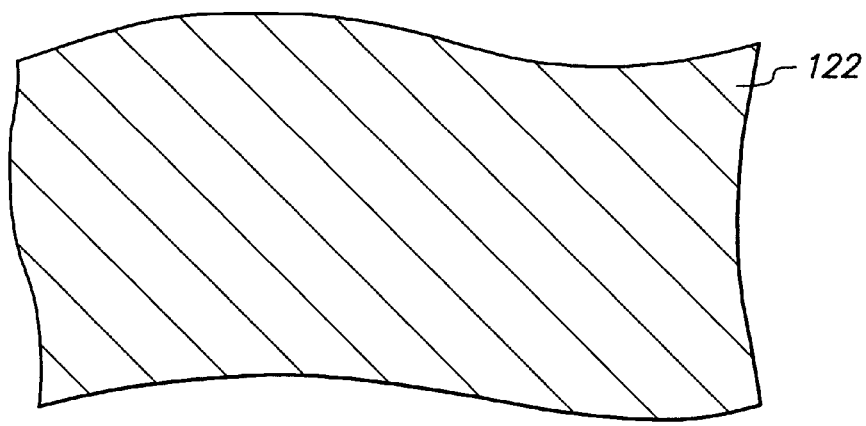
Figure 7B:
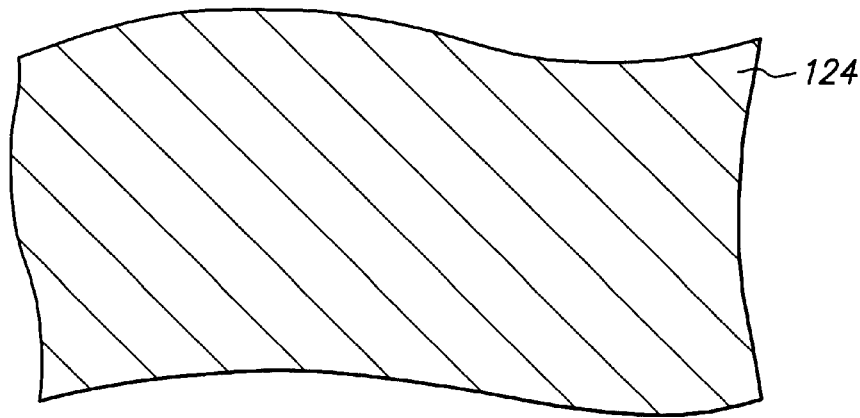
Figure 6C:
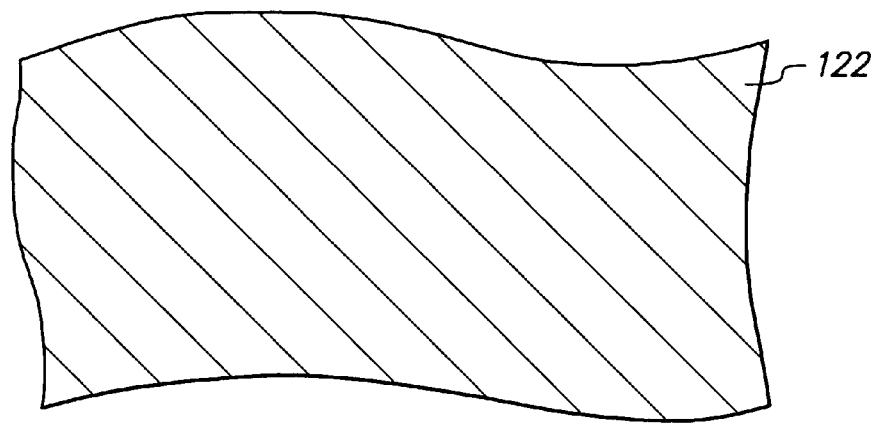
Figure 7C:
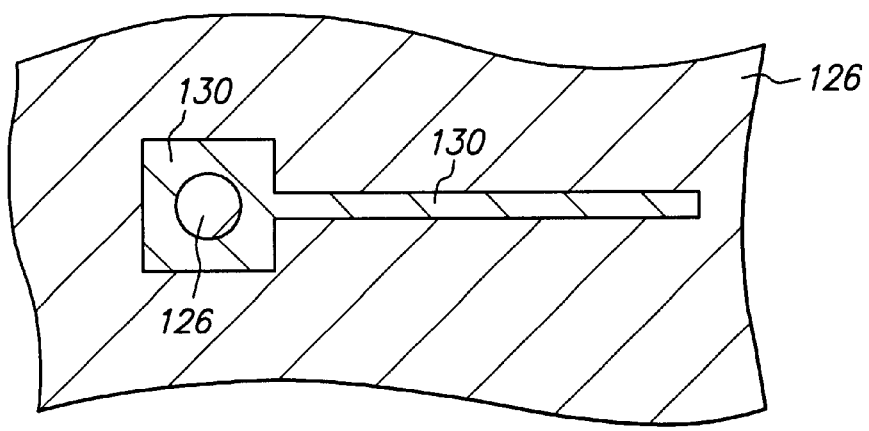
Figure 6D:
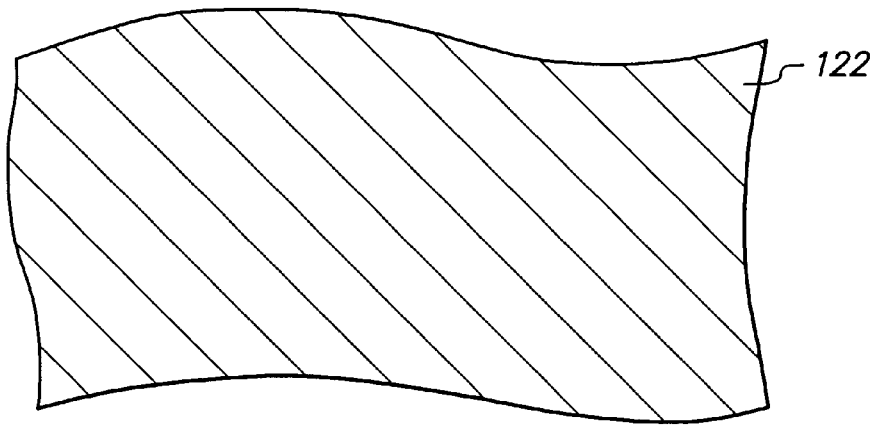
Figure 7D:
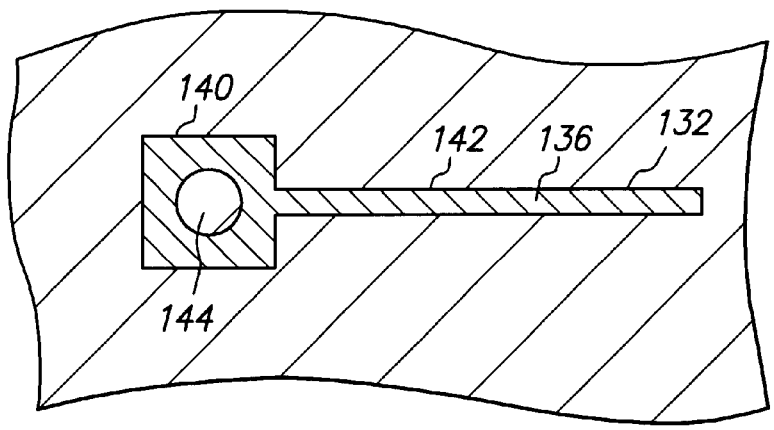
Figure 6E:
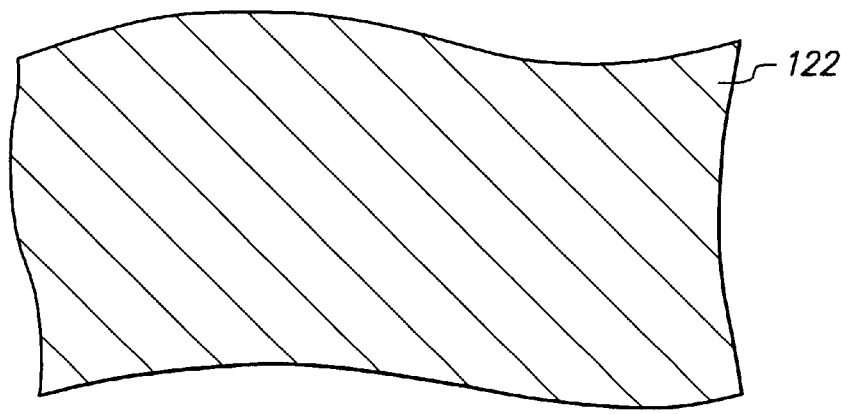
Figure 7E:
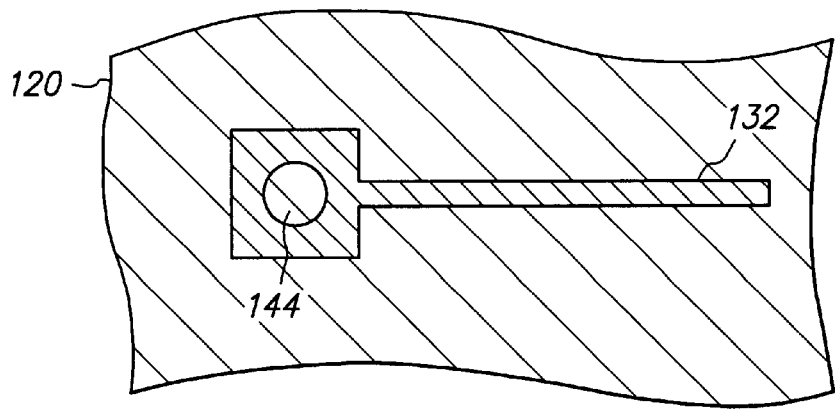
Figure 6F:
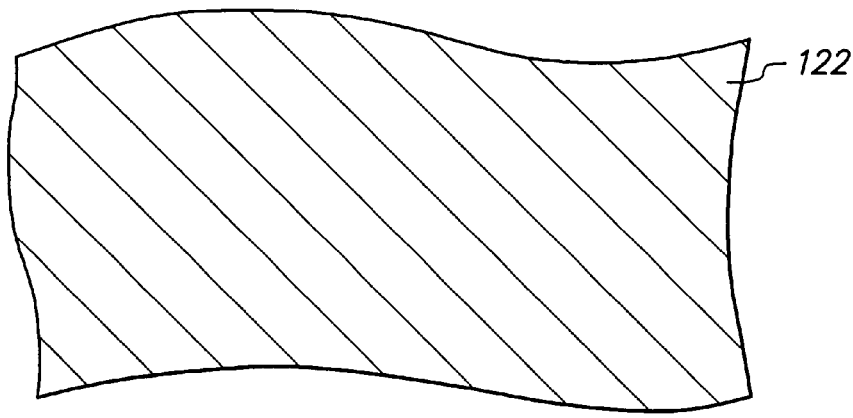
Figure 7F:
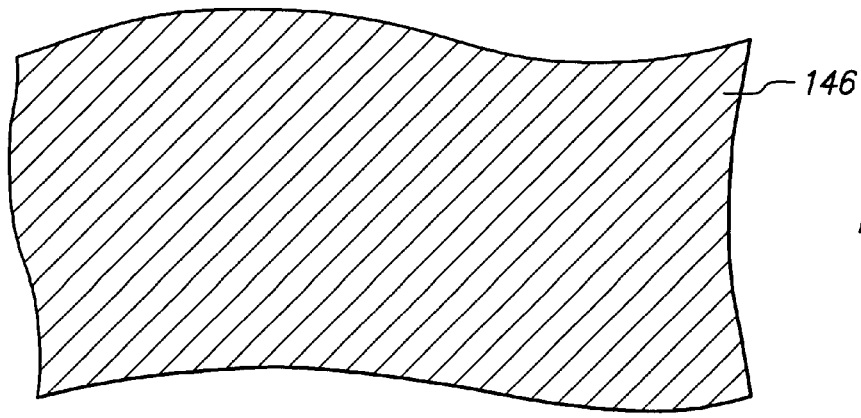
Figure 6G:
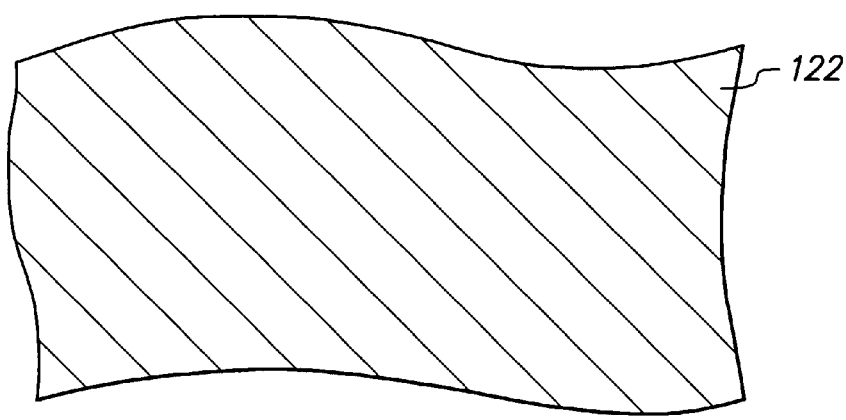
Figure 7G:
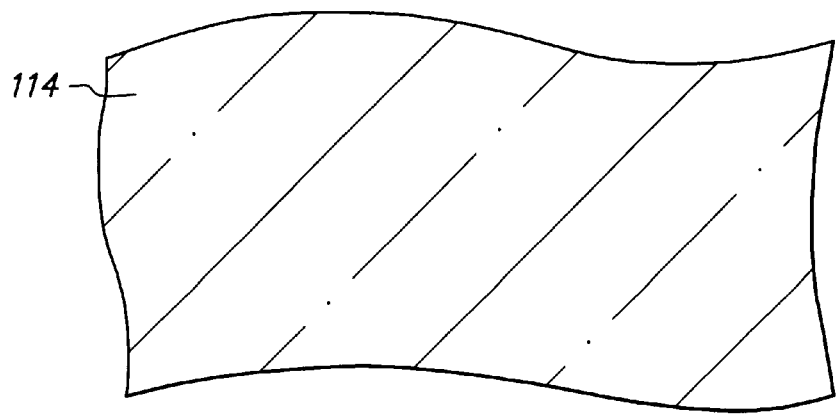
Figure 6H:
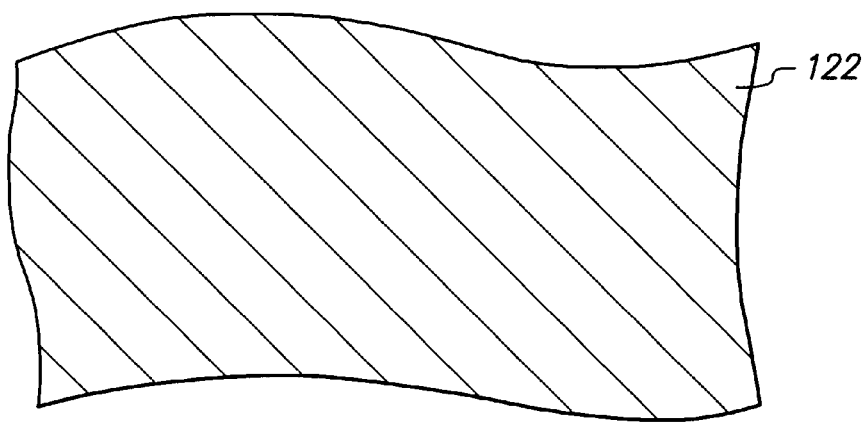
Figure 7H:
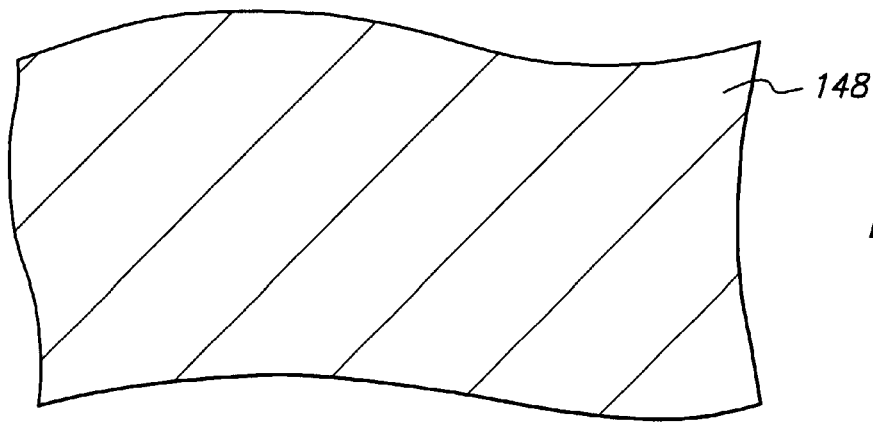

FIG. 4E shows the completed assembly after ball bond 70 solidifies to form connection joint 52, clamp 66 closes, and capillary 60 moves in a horizontal loop and then downward with a force of 70 to 90 grams in order to cut wire 64 at its edge in proximity to cap 74 thereby disconnecting wire 64 from connection joint 52. As a result, connection joint 52 has a mushroom-shape with an inconsequential inverted U-shaped tail 76 that extends above cap 74. Of importance, connection joint 52 forms an alloyed metallic bond to pad 16 and conductive trace 32 at essentially the same time during a single thermosonic ball bonding operation.

At this stage, the manufacture of a semiconductor chip assembly that includes chip 10 and conductive trace 32 can be considered complete. Conductive trace 32 is mechanically and electrically coupled to chip 10 by adhesive 46 and connection joint 52, respectively. Conductive trace 32 extends beyond an outer edge of chip 10 and provides horizontal fan-out routing between pad 16 and external circuitry. Advantageously, conductive trace 32 is a single continuous metal segment that is the inner lead (or inner end) of a TAB lead.

The semiconductor chip assembly includes other conductive traces embedded in adhesive 46, and only a single conductive trace 32 is shown for convenience of illustration. The conductive traces are each connected to a respective pad on chip 10 by a respective connection joint in a respective through-hole. Furthermore, the conductive traces each extend across an outer edge of chip 10 proximate to their respective pads to provide horizontal fan-out routing for their respective pads. The conductive traces are electrically isolated from one another by adhesive 46 after base 20 is removed. Advantageously, since base 20 provides a plating bus for forming the conductive traces, and the connection joints are formed by ball bonding, there is no plating bus or related circuitry that need be disconnected or severed from chip 10 or the conductive traces after base 20 is removed and the connection joints are formed.

FIGS. 5A–5N, 6A–6N and 7A–7N are cross-sectional, top and bottom views, respectively, of a method of connecting a conductive trace to a semiconductor chip in accordance with another embodiment of the present invention. In this embodiment, the chip is one of many chips on a wafer when the conductive trace is connected to the pad, and then the chip is singulated from other chips on the wafer to form a chip size package. In addition, the conductive trace provides fan-in routing for the pad. Furthermore, the entire base is not removed, instead, a portion of the base over the through-hole is removed while another portion of the base remains to form a pillar that is electrically connected to the conductive trace and provides vertical routing for the pad. For purposes of brevity, any description in the previous embodiment is incorporated herein insofar as the same is applicable, and the same description need not be repeated. Likewise, elements of the current embodiment similar to those in the previous embodiment have corresponding reference numerals indexed at one-hundred rather than zero. For instance, chip 110 corresponds to chip 10, base 120 corresponds to base 20, etc.

FIGS. 5A–5H, 6A–6H and 7A–7H depict manufacturing steps generally similar to those in FIGS. 1A–1H, 2A–2H and 3A–3H, except as follows.

First, chip 110 is one of many chips on a wafer. Chip 110 has yet to be singulated from other chips on the wafer is not singulated until after it is mechanically and electrically connected to conductive trace 132, whereas chip 10 is singulated before it is mechanically or electrically connected to conductive trace 32.

Second, base 120 has a thickness of 150 microns, whereas base 20 has a thickness of 100 microns. Base 120 is thicker since, as described below, a portion of base 120 remains connected to conductive trace 132 after connection joint 152 is formed and provides vertical routing for pad 116.

Third, conductive trace 132 fans-in towards the center of chip 110, whereas conductive trace 32 fans-out across an outer edge of chip 10.

Fourth, conductive trace 132 is not an inner lead of a TAB lead, whereas conductive trace 32 is an inner lead of a TAB lead.

Fifth, adhesive 146 is 10 microns thick (between chip 110 and conductive trace 132), whereas adhesive 46 is 25 microns thick (between chip 10 and conductive trace 32). Adhesive 146 is thinner since it need not support a conductive trace that fans-out beyond the chip.

Sixth, encapsulant 148 contacts only bottom surface 114 of chip 110 since the four outer edges of chip 110 are not exposed until singulation occurs, whereas encapsulant 48 contacts both the outer edges and bottom surface 14 of chip 10.

Figure 5A:
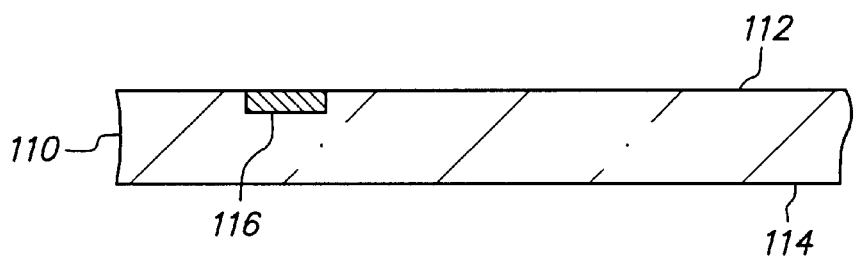
FIGS. 5A–5N are cross-sectional views showing a method of connecting a conductive trace to a semiconductor chip in accordance with another embodiment of the present invention.
Figure 5B:
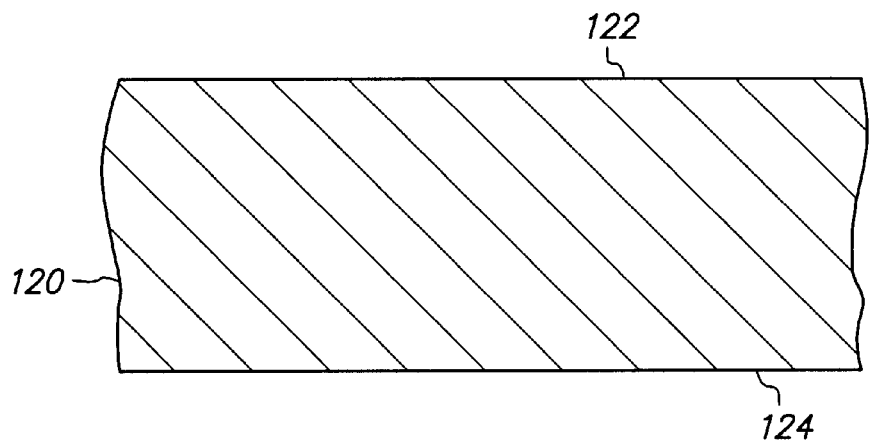
Figure 5C:
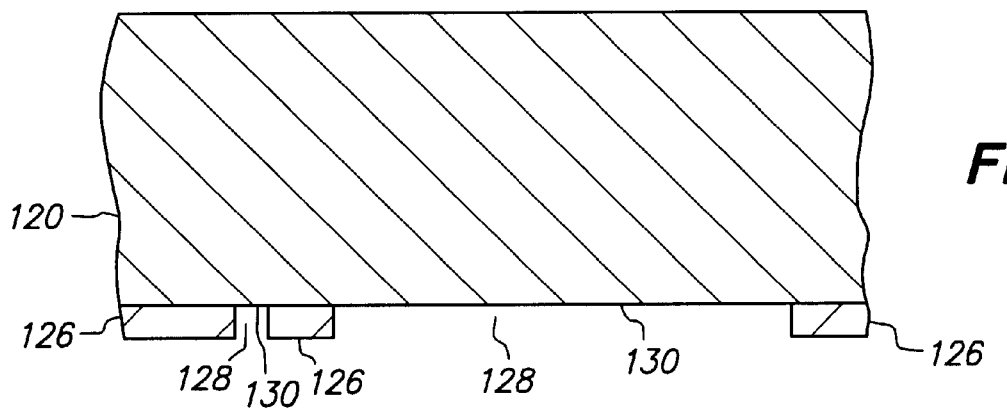
Figure 5D:
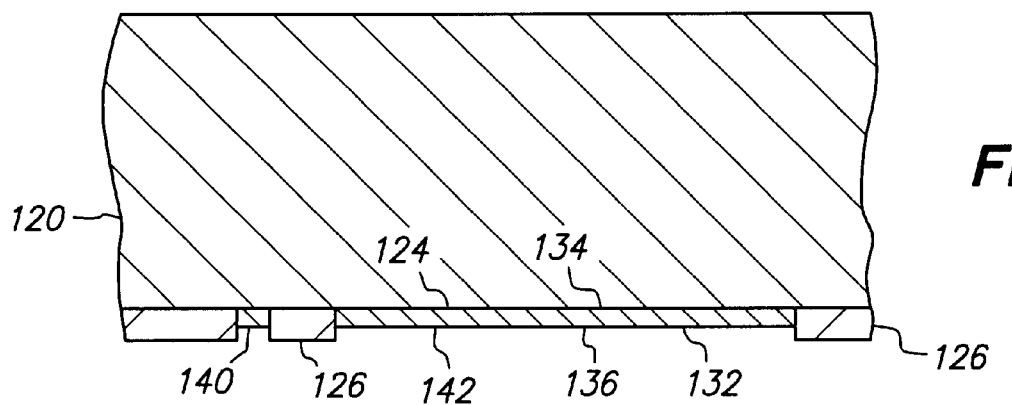
Figure 5E:
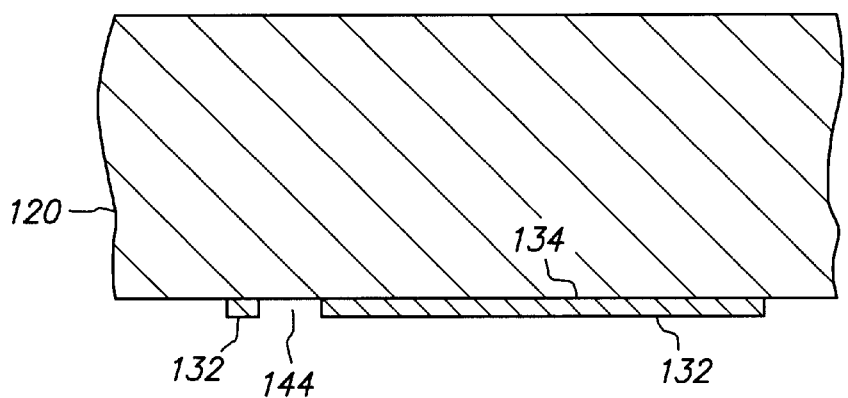
Figure 5F:
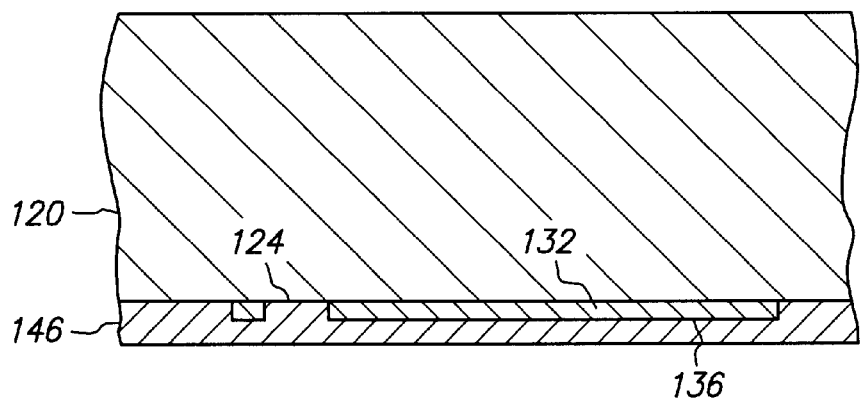
Figure 5G:
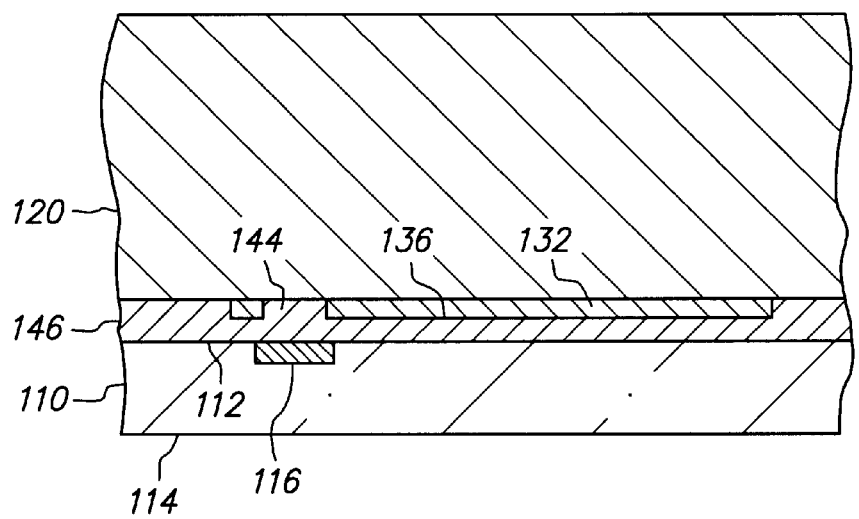
Figure 5H:
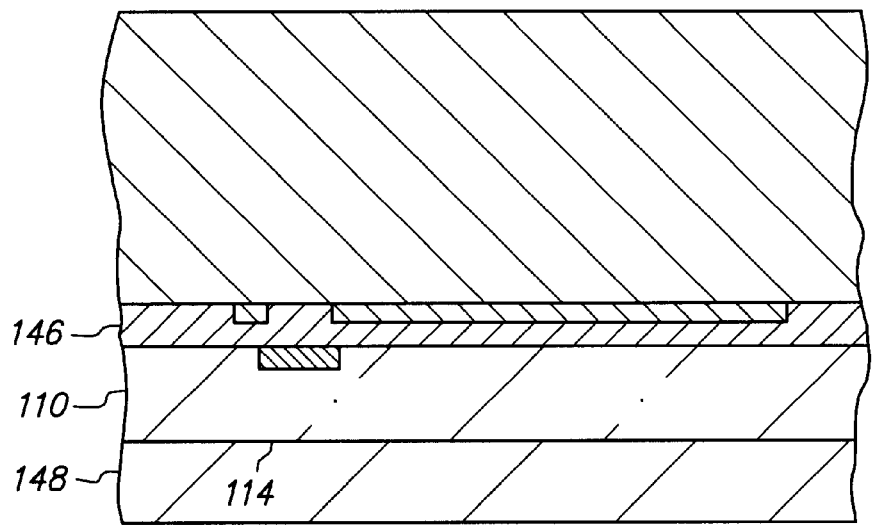
Figure 5I:
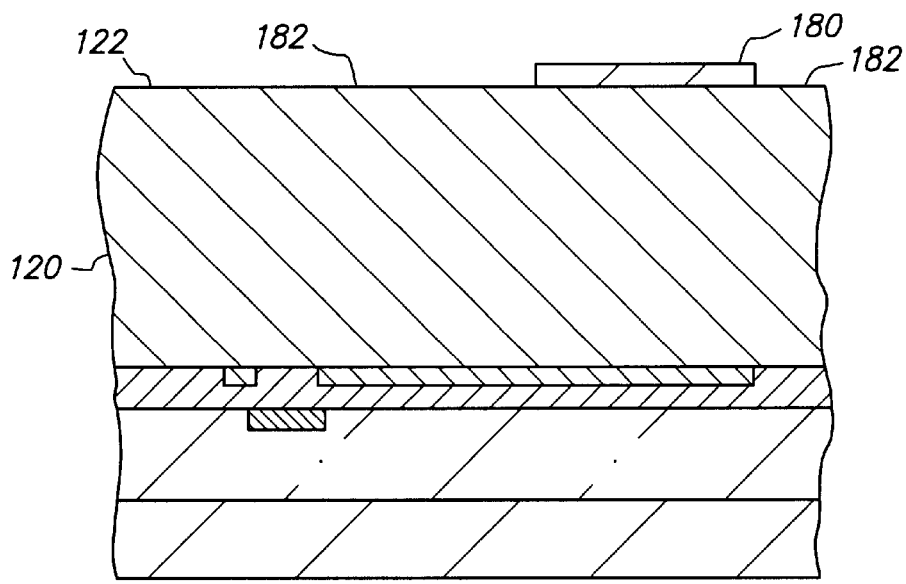
Figure 6I:
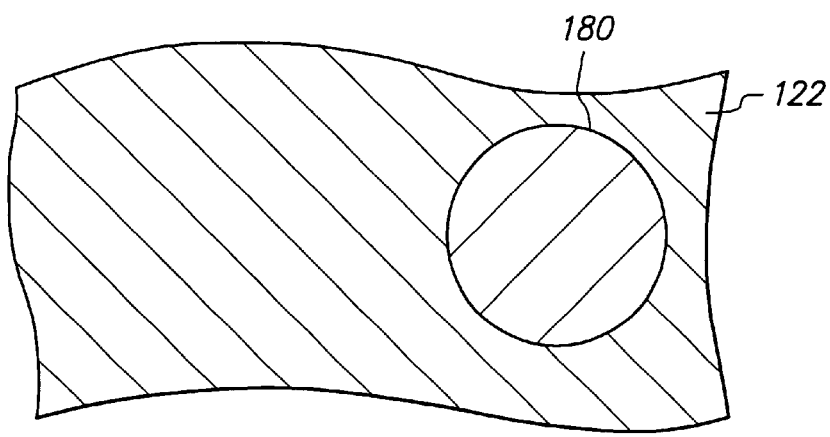
Figure 7I:
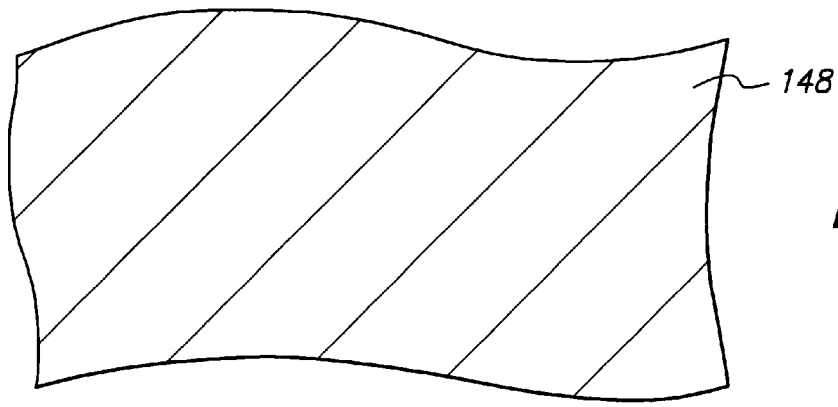

FIGS. 5I, 6I and 7I are cross-sectional, top and bottom views, respectively, of photoresist layer 180 formed on top surface 122 of base 120. Photoresist layer 180 is deposited as a continuous layer and then patterned by selectively applying light through a reticle (not shown), applying a developer solution to remove the photoresist portions rendered soluble by the light, and then hard baking, as is conventional. As a result, photoresist layer 180 contains an opening that selectively exposes portion 182 of top surface 122. Photoresist layer 180 has a thickness of 10 microns.

Figure 5J:
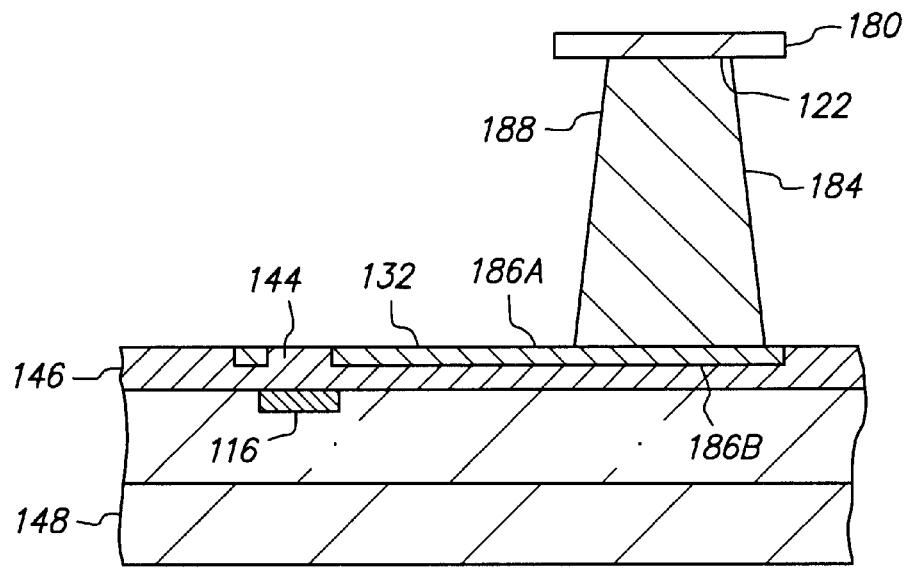
Figure 6J:
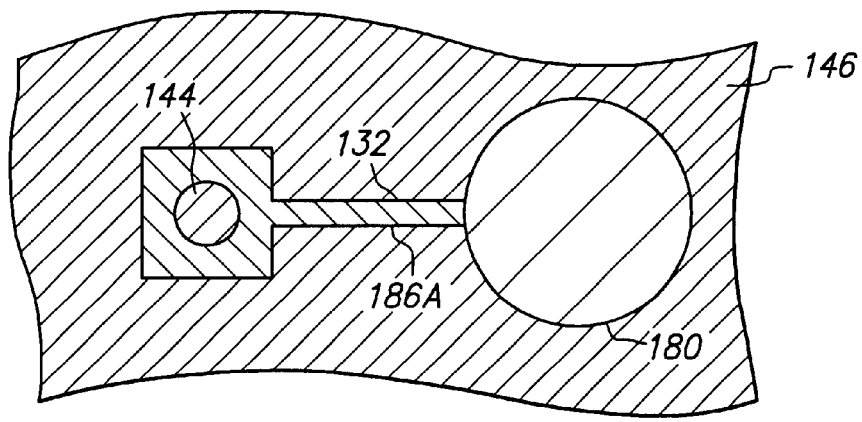
Figure 7J:
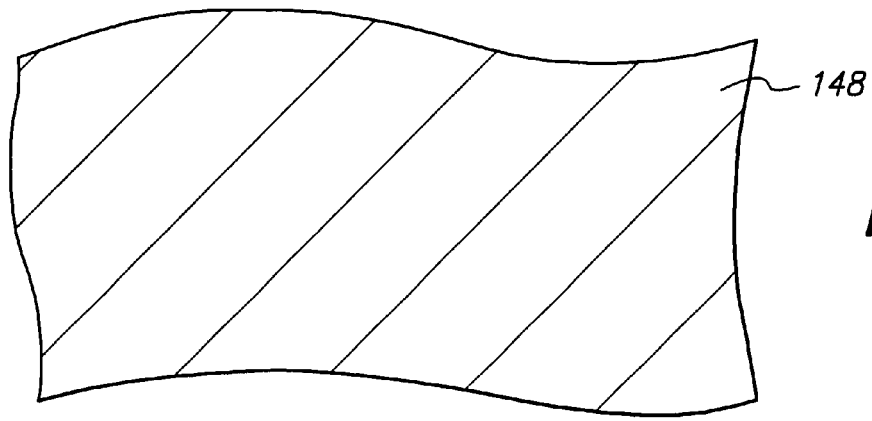

FIGS. 5J, 6J and 7J are cross-sectional, top and bottom views, respectively, of the partially completed assembly after a portion of base 120 above through-hole 144 is removed and a remaining portion of base 120 forms pillar 184. A "front-side" wet chemical etch is applied to exposed portion 182 of top surface 122 using photoresist layer 180 as an etch mask. For instance, the wet chemical etch can be sprayed on photoresist layer 180 and exposed portion 182, or the structure can be dipped in the wet chemical etch since the back-side is protected by encapsulant 148. Thus, pillar 184 is formed subtractively. The wet chemical etch is highly selective of copper with respect to gold, polyimide and epoxy. Therefore, no appreciable amount of conductive trace 132, adhesive 146 or encapsulant 148 is removed. A suitable wet chemical etch can be provided by a solution containing alkaline ammonia, sulfuric acid with hydrogen peroxide, chromic-sulfuric acid, phosphoric acid with ammonium persulfate, copper sulfate, copper chloride or ferric chloride.

The wet chemical etch etchs completely through exposed portion 182 of base 120. As a result, the wet chemical etch exposes first portion 186A of conductive trace 132 that includes enlarged rectangular portion 140 and a portion of routing portion 142 adjacent thereto, and pillar 184 covers and remains electrically connected to second portion 186B of conductive trace 132. Accordingly, the combination of conductive trace 132 and pillar 184 forms routing line 188. Likewise, the wet chemical etch exposes through-hole 144 and portions of adhesive 146 inside through-hole 144, outside pillar 184 and outside first portion 186A of conductive trace 132. Pillar 184 extends 150 microns above conductive trace 132.

Furthermore, since the wet chemical etch undercuts (i.e., laterally etches) base 120 beneath photoresist layer 180, pillar 184 tapers inwardly with increasing height. A suitable taper is between 45 and slightly less than 90 degrees, such as approximately 75 degrees. Pillar 184 has a diameter of 400 microns at its base that decreases with increasing height and is narrowest at top surface 122, and pillar 184 has a flat top surface at what remains of top surface 122. The optimal etch time for exposing portion 182 of top surface 122 to the wet chemical etch in order to form pillar 184 with the desired dimensions can be established through trial and error. At this stage, adhesive 146 continues to cover pad 116, fill through-hole 144, and provides critical mechanical support for routing line 188 which would otherwise be a dangling lead.

Figure 5K:
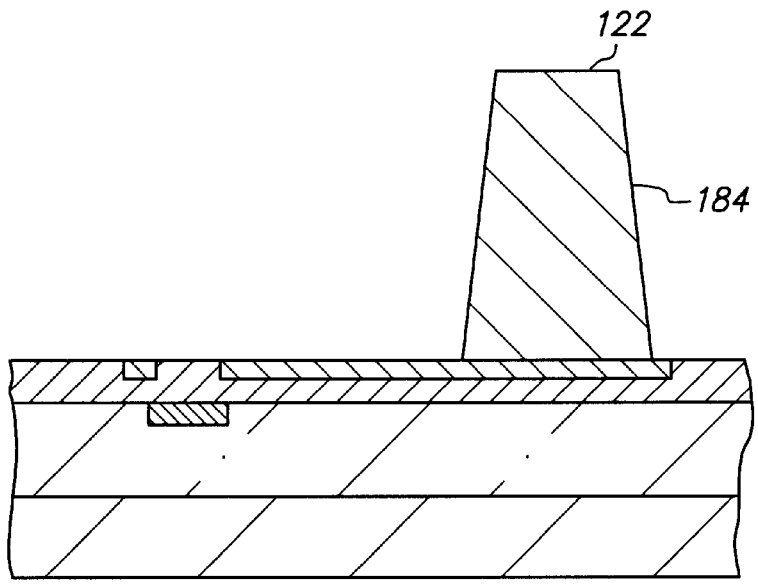
Figure 6K:
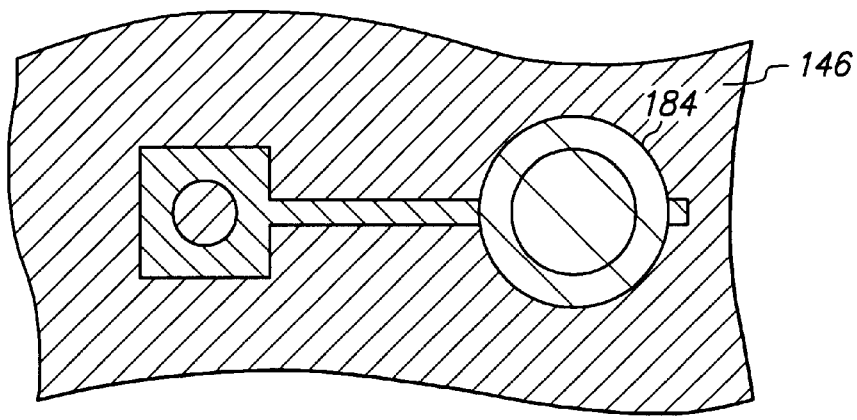
Figure 7K:
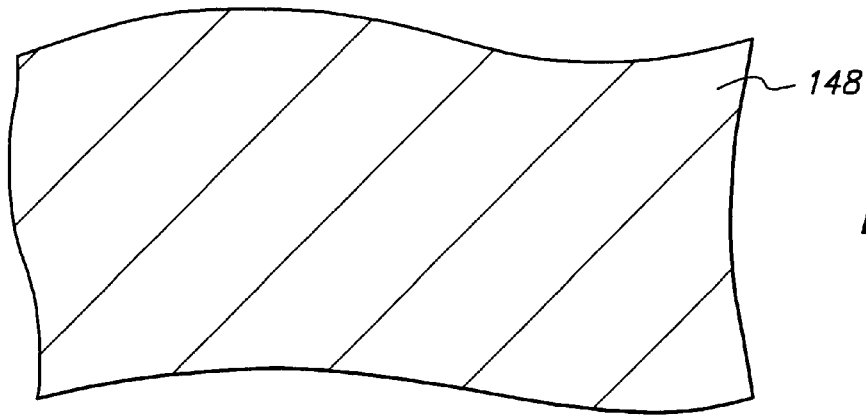

FIGS. 5K, 6K and 7K are cross-sectional, top and bottom views, respectively, of the partially completed assembly after photoresist layer 180 is stripped.

Figure 5L:
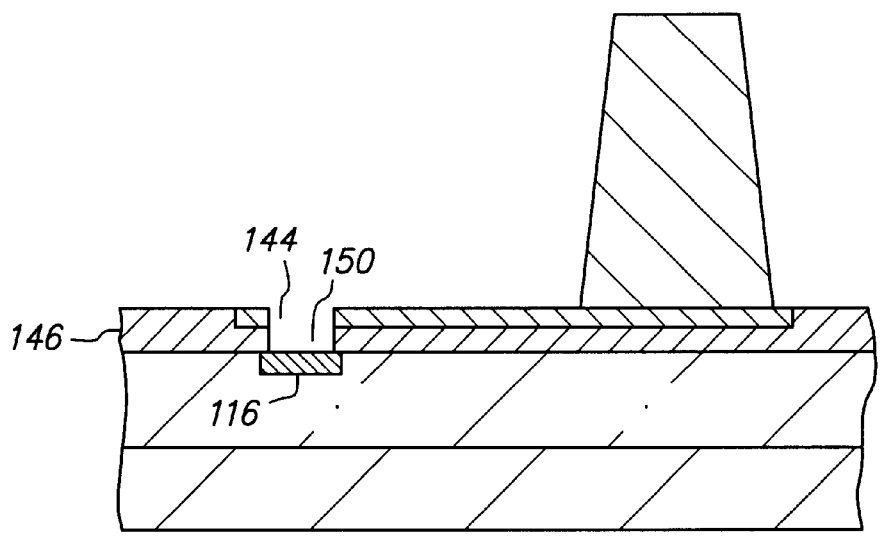
Figure 6L:
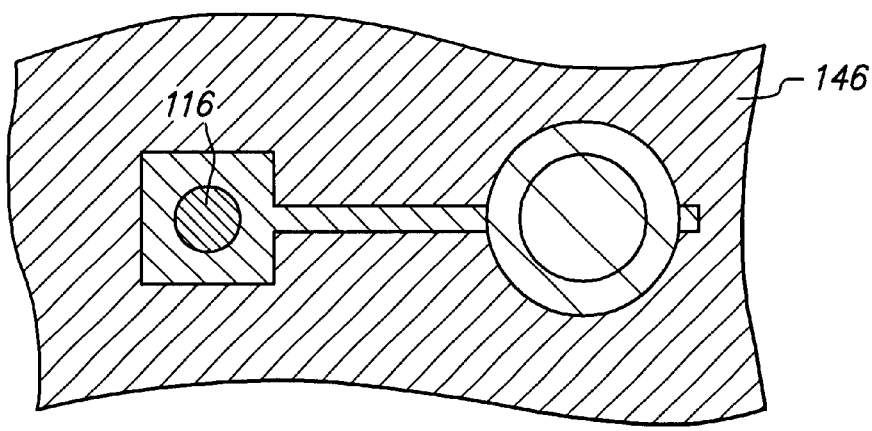
Figure 7L:
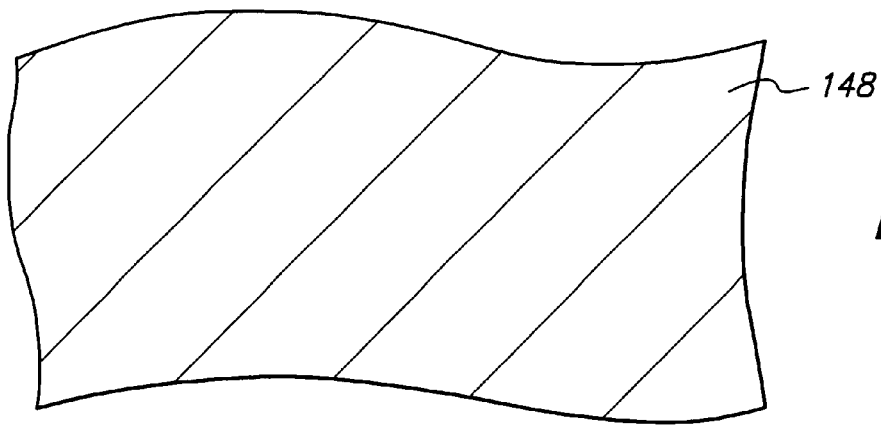

FIGS. 5L, 6L and 7L are cross-sectional, top and bottom views, respectively, of opening 150 formed in adhesive 146 by applying a selective laser etch. The combination of through-hole 144 and opening 150 expose pad 116.

Figure 5M:
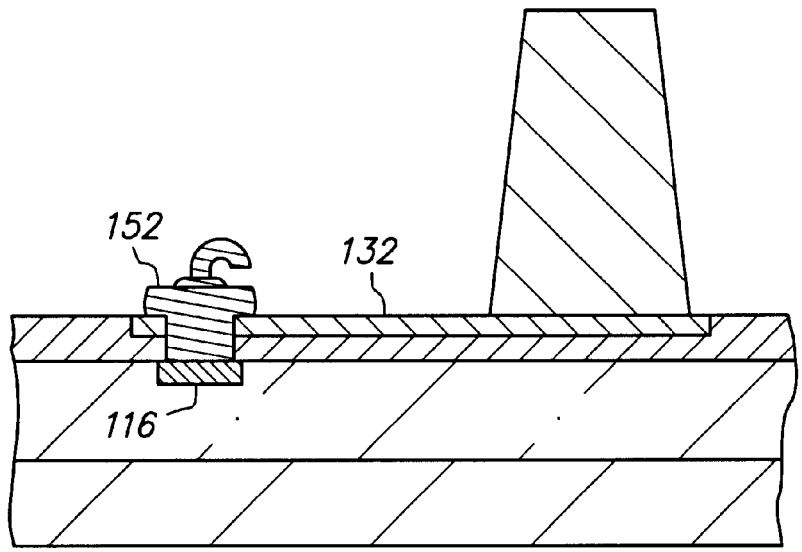
Figure 6M:
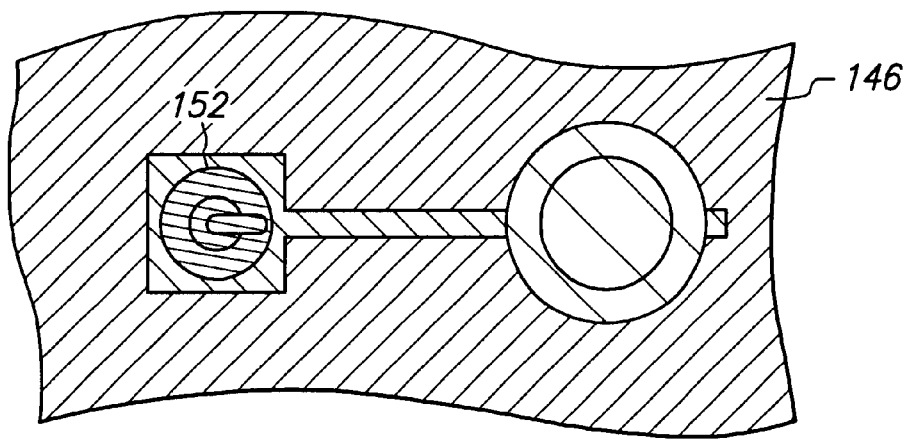
Figure 7M:
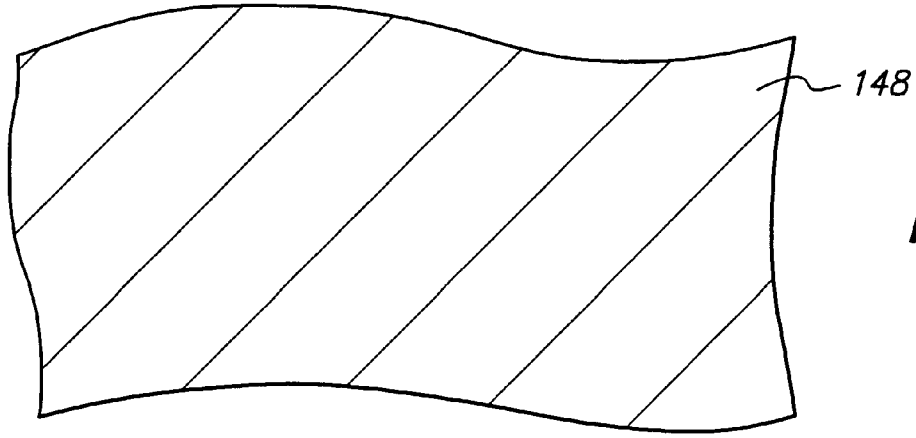

FIGS. 5M, 6M and 7M are cross-sectional, top and bottom views, respectively, of the partially completed assembly after connection joint 152 is formed by thermosonic ball bonding. Connection joint 152 is formed in through-hole 144 and opening 150, and contacts and electrically connects pad 116 and conductive trace 132. Since adhesive 146 is thinner than adhesive 46, opening 150 has a smaller volume than opening 50, and therefore a smaller wire ball (with a 50 micron diameter) can be used than wire ball 62 (with a 60 micron diameter).

Figure 5N:
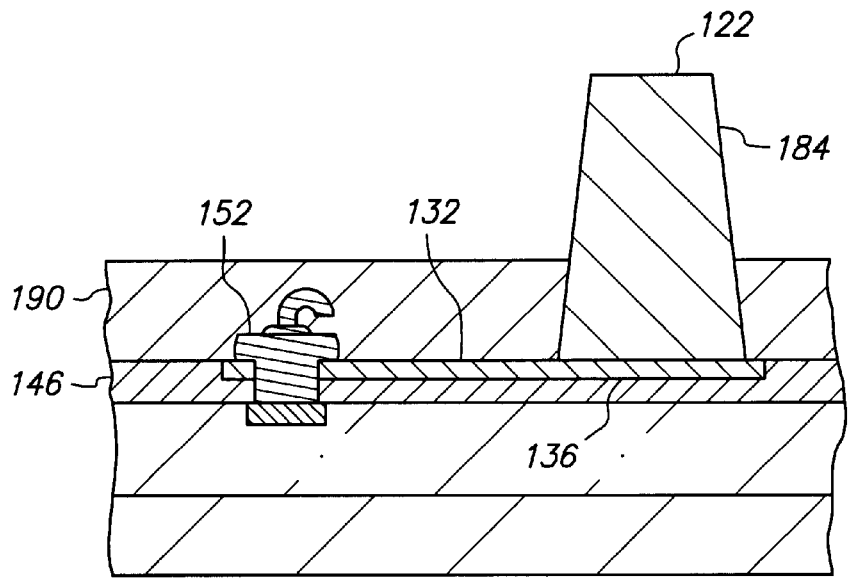
Figure 6N:
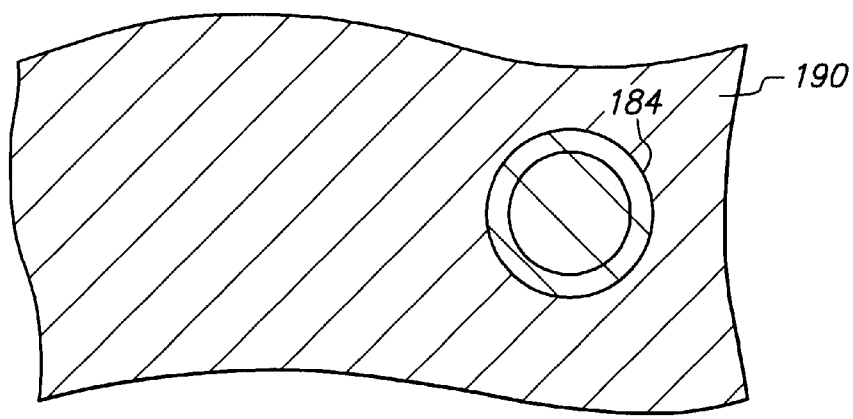
Figure 7N:
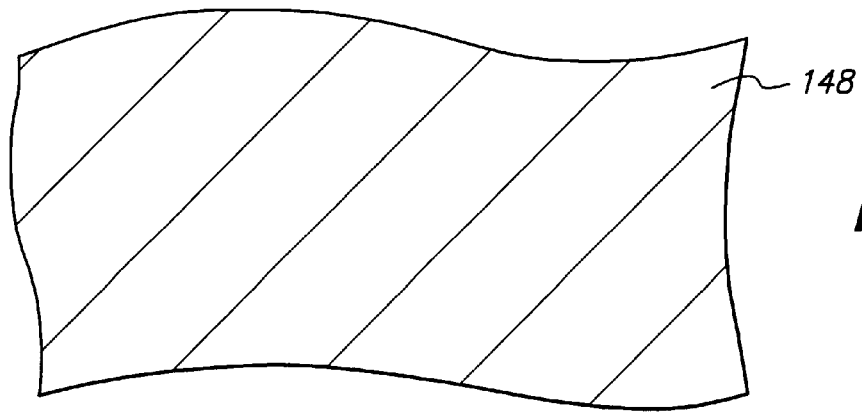

FIGS. 5N, 6N and 7N are cross-sectional, top and bottom views, respectively, of the fully completed assembly after insulative base 190 is formed over conductive trace 132 and connection joint 152. Insulative base 190 is relatively flat and has a thickness of 50 microns. Insulative base 190 contacts and adheres to conductive trace 132, adhesive 146, connection joint 152 and a lower portion of pillar 184. Although insulative base 190 covers conductive trace 132, adhesive 146, connection joint 152 and a lower portion of pillar 184, an upper portion of pillar 184 extends 100 microns above insulative base 190. Thus, insulative base 190 does not extend to top surface 122 or bottom surface 136. Preferably, insulative base 190 is initially an epoxy in paste form that includes an epoxy resin, a curing agent, an accelerator and a filler. The filler is an inert material, such as silica (powdered fused quartz), that improves thermal conductivity, thermal shock resistance, and thermal coefficient of expansion matching. The epoxy paste is selectively coated over conductive trace 132, adhesive 146, connection joint 152 and the lower portion of pillar 184 but not the upper portion of pillar 184 or top surface 122 using screen printing, and then the epoxy is cured or hardened at relatively low temperature in the range of 100–250° C. to form a solid adherent insulative layer that provides additional mechanical strength for conductive trace 132 and protection for connection joint 152. For instance, if a solder joint is subsequently formed at the top of pillar 184 during the next level assembly, insulative base 190 protects conductive trace 132 and connection joint 152 from solder reflow.

At this stage, the manufacture of a semiconductor chip assembly that includes chip 110, routing line 188 and insulative base 190 can be considered complete. Routing line 188 is mechanically and electrically coupled to chip 110 by adhesive 146 and connection joint 152, respectively. Conductive trace 132 extends towards the center of chip 110 and provides horizontal fan-in routing between pad 116 and pillar 184, and pillar 184 provides vertical routing between conductive trace 132 and top surface 122. Stated differently, the combination of conductive trace 132, connection joint 152 and pillar 184 provides horizontal and vertical routing between pad 116 and a terminal on a printed circuit board (not shown) above top surface 122 in a subsequent next level assembly.

The semiconductor chip assembly includes other conductive traces embedded in adhesive 146, and only a single conductive trace 132 is shown for convenience of illustration. The conductive traces are each connected to a respective pad on chip 110 by a respective connection joint in a respective through-hole, and are each directly connected at the opposite end to a respective pillar. Furthermore, the conductive traces and pillars provide horizontal fan-in routing and vertical routing for their respective pads. The conductive traces are electrically isolated from one another by adhesive 146 and insulative base 190. Advantageously, since base 120 provides a plating bus before it is etched, and the connection joints are formed by ball bonding, there is no plating bus or related circuitry that need be disconnected or severed from chip 110 or the conductive traces after base 120 is etched and the connection joints are formed. If desired, solder balls can be screen printed on the tops of the pillars to provide connections to the next level assembly. Finally, chip 110 is singulated from other chips on the wafer, thereby singulating the assembly from other assemblies, so that the assembly forms a chip size package.

The semiconductor chip assemblies described above are merely exemplary. Numerous other embodiments are contemplated.

The conductive trace can have various shapes and sizes and can be various conductive metals including copper, gold, nickel, aluminum, tin, combinations thereof, and alloys thereof. The preferred composition of the conductive trace will depend on the nature of the connection joint as well as design and reliability factors. For instance, if a gold ball bond connection joint is used, the conductive trace can be a 5 micron layer of gold, or alternatively, a 4.5 micron layer of nickel electroplated on a 0.5 micron layer of gold electroplated on a copper base to reduce costs, or alternatively, a 4 micron layer of nickel electroplated on a 0.5 micron layer of gold electroplated on a 0.5 micron layer of tin electroplated on a copper base to reduce costs and avoid gold-copper alloys that may be difficult to remove when the copper base is etched. If desired, the conductive trace can be spot plated near the through-hole to make it compatible with receiving the connection joint. For instance, a copper conductive trace can be spot plated with nickel and then silver to make it compatible with a gold ball bond connection joint and avoid the formation of brittle silver-copper intermetallic compounds.

Furthermore, those skilled in the art will understand that in the context of a semiconductor chip assembly, a copper conductive trace or pillar is typically a copper alloy that is mostly copper but not pure elemental copper, such copper-zirconium (99.9% copper), copper-silver-phosphorus-magnesium (99.7% copper), or copper-tin-iron-phosphorus (99.7% copper).

The conductive trace may function as a signal, power or ground layer depending on the purpose of the associated chip pad. The conductive trace need not necesarily extend above the top surface of the insulative base, a pad, or a pillar (columnar post) can be deposited on the conductive trace or be a top portion of the conductive trace. A pillar is particularly well-suited for reducing thermal mismatch related stress in the next level assembly. A pillar can be formed in numerous manners, including additive and substractive techniques. Likewise, the conductive trace can fan-in or fan-out or both, regardless of whether it is connected to a pillar.

The pad can have numerous shapes including a flat rectangular shape and a bumped shape. For instance, a bump-shaped pad may extend into the through-hole and may even extend above the conductive trace. The pad can either be partially or completely exposed by the through-hole prior to forming the connection joint. The pad can have a length and width that are larger than, equal to, or smaller than the diameter of the through-hole. Preferably, the pad and through-hole have the same or similar size, and essentially all of the pad is directly beneath the through-hole.

The through-hole can have a circular, ovular, square, rectangular or other shape (as viewed from the top surface). Furthermore, the through-hole sidewalls may have a wide variety of shapes and slopes including vertical sidewalls, tapered sidewalls, continuous sidewalls and stepped sidewalls.

Preferably, the insulative base has a thickness of 25 to 50 microns, the routing portion of the conductive trace has a width of 10 to 100 microns and a thickness of 5 to 40 microns, the pillar has a diameter of 300 to 500 microns that decreases with increasing height, a height of 150 to 300 microns and extends 50 to 250 microns above the insulative base, and the through-hole has a diameter of 50 to 100 microns. Of course, other dimensions are suitable.

The insulative base may be rigid or flexible, and may be formed from numerous organic or inorganic insulators such as tape (polyimide), epoxy, silicone, glass (aramid) and ceramic. Organic insulators are preferred for low cost, high dielectric applications, whereas inorganic insulators are preferred when high thermal dissipation and a matched thermal coefficient of expansion are important. The insulative base can be deposited only on the conductive trace, or alternatively, deposited over the pillar and the conductive trace and then etched back so that a top portion of the pillar is exposed.

Numerous adhesives can be applied between the chip and the conductive trace. For instance, the adhesive can be applied as a paste, a laminated layer, or a liquid applied by screen-printing, spin-on, or spray-on. If a paste or liquid adhesive is applied, the adhesive may fill the through-hole and be subsequently removed. If a laminated adhesive is applied then no appreciable amounts of adhesive may reside inside the through-hole. Thermosetting adhesive liquids and pastes such as epoxies are generally suitable. Likewise, thermoplastic adhesives are also generally suitable. Furthermore, the opening in the adhesive beneath the through-hole may be formed either before or after mechanically attaching the conductive trace to the chip. For instance, the adhesive can be applied as a liquid or paste (A stage) to the bottom surface of the conductive trace, the adhesive can be partially cured (B stage), a back-side etch can form the opening in the adhesive, the partially cured adhesive can be brought into contact with the chip, and then the adhesive can be fully cured (C stage). Alternatively, the liquid or paste adhesive can be sandwiched between the chip and the conductive trace, the adhesive can be fully cured thereby mechanically fastening the chip to the conductive trace, and then a front-side etch can form the opening in the adhesive.

Numerous etches can be applied to form the pillar as well as the opening in the adhesive. For instance, the opening in the adhesive can be formed by laser direct write (without a mask) or a plasma etch. In addition, these etches can be performed in various sequences. For instance, the front-side etch that forms the pillar can be applied before or after the through-hole is exposed and before or after the connection joint is formed.

A ball bond connection joint may be formed by thermocompression or thermosonic wire bonding and composed of any conventional bonding wire material including gold, silver, copper, palladium, and alloys thereof. For instance, gold alloyed with a small amount of beryllium exhibits grain growth at low temperature which enhances stability and increases strength by precipitation hardening. Gold alloyed with 5 to 10 ppm beryllium by weight or 30 to 100 ppm copper by weight is commonly used for thermocompression and thermosonic wire bonding. Similarly, gold alloyed with 1 percent palladium raises the recrystallization temperature so that the fully annealed area above the ball bond resulting from the thermal source (such as electronic flame-off), called the heat-affected zone (HAZ), is extremely short, resulting in a short tail or stump on the ball bond after the wire is broken from the ball bond with a simple upward vertical movement. Furthermore, aluminum alloyed with small amounts of silicon, magnesium or both has been proposed for thermosonic wire bonding.

A ball bond connection joint may be formed by initially contacting the wire ball to the pad, the conductive trace, or both, depending on the relative dimensions of the wire ball and the through-hole. Likewise, the diameter of the wire ball may be larger, smaller, or equal to the diameter of the through-hole. If, for instance, the diameter of the wire ball is smaller than the diameter of the through-hole and the wire ball initially contacts the pad without contacting the conductive trace, then it may be desirable to move the capillary in a horizontal loop to assure that the ball bond contacts the conductive trace and fills the through-hole. Furthermore, the capillary can be withdrawn (clamp open) and then reapplied (clamp closed) to supply additional gold to the ball bond.

A ball bond connection joint may completely or partially fill the through-hole. It is generally preferred that the ball bond connection joint completely fill the through-hole and contact a top surface of the conductive trace in order to maximize the contact area with the conductive trace and the pad. However, if the wire ball seals the through-hole before adequately contacting the pad, then trapped air between the wire ball and the pad may create a compressive force that prevents the wire ball from adequately contacting the pad. Trapped air can be reduced or eliminated by proper choice of shapes and dimensions. For example, if the through-hole has sidewalls that taper at an angle such as 45 degrees so that the diameter increases with increasing height, the opening in the adhesive has the same diameter as the bottom of the through-hole, and the wire ball contacts the pad before contacting the conductive trace, then little or no trapped air should occur. The through-hole sidewalls can be tapered in various manners such as tapering the sidewalls of the photoresist layer that defines the through-hole or applying a suitable etch to the conductive trace. See, for instance, U.S. application Ser. No. 09/665,931, filed Sep. 20, 2000 by Charles W. C. Lin entitled "Method of Making a Support Circuit with a Tapered Through-Hole for a Semiconductor Chip Assembly" which is incorporated by reference.

After a ball bond connection joint is formed, the tail can be reduced or eliminated. For instance, the tail can be flattened or "coined" using a secondary operation after cutting the wire. Alternatively, before moving or after slightly moving the capillary vertically upwards and away from the ball bond, the clamp can be closed and then the capillary can be moved horizontally to shear the wire from the ball bond at or near their juncture. This shearing operation requires that the capillary have adequate clearance for the horizontal motion, which will depend on the dimensions and shapes of the capillary and the ball bond as well as the amount of the upward vertical movement. As another example, the wire bonding equipment may include a blade that creates a notch in the wire to provide a weak point that subsequently breaks.

The connection joint can be formed from a wide variety of materials including copper, gold, nickel, palladium, tin, alloys thereof, and combinations thereof, can be formed by a wide variety of processes including electroplating, electroless plating, ball bonding and solder reflow, and can have a wide variety of shapes and sizes. The choice between a connection joint that partially or completely fills the through-hole and the shape and composition of the connection joint depends on design and reliability considerations. Further details regarding an electroplated connection joint are disclosed in U.S. application Ser. No. 09/643,212, filed Aug. 22, 2000 by Charles W. C. Lin entitled "Semiconductor Chip Assembly with Simultaneously Electroplated Contact Terminal and Connection Joint" which is incorporated by reference. Further details regarding an electrolessly plated connection joint are disclosed in U.S. application Ser. No. 09/643,214, filed Aug. 22, 2000 by Charles W. C. Lin entitled "Semiconductor Chip Assembly with Simultaneously Electrolessly Plated Contact Terminal and Connection Joint" which is incorporated by reference. Further details regarding a ball bond connection joint are disclosed in U.S. application Ser. No. 09/665,928, filed Sep. 20, 2000 by Charles W. C. Lin entitled "Semiconductor Chip Assembly with Ball Bond Connection Joint" which is incorporated by reference.

After the connection joint is formed, further encapsulation can be performed but is generally not necessary. In particular, it may not be necessary to fill a conductor or insulator into whatever space remains in the through-hole or deposit an insulator over the conductive trace and/or insulative base. However, it may be desirable to provide an encapsulant to enhance the mechanical strength of the assembly.

After the connection joint is formed, a soldering material or solder ball can be deposited over the pillar by plating or printing or placement techniques if required for the next level assembly. However, the next level assembly may not require that the semiconductor chip assembly contain solder. For instance, in land grid array (LGA) packages, the soldering material is normally provided by the panel rather than the contact terminals on the semiconductor chip assembly.

After the connection joint is formed, if a plating bus exists then it is disconnected from the conductive trace. The plating bus can be disconnected by mechanical sawing, laser cutting, chemical etching, and combinations thereof. If the plating bus is disposed about the periphery of the assembly but is not integral to the assembly, then the plating bus can be disconnected when the assembly is singulated from other assemblies. However, if the plating bus is integral to the assembly, or singulation has already occurred, then a photolithography step can be added to selectively cut related circuitry on the assembly that is dedicated to the plating bus since this circuitry would otherwise short the conductive traces together.

The working format for the semiconductor chip assembly can be a single chip, a wafer, a strip or a panel based on the manufacturing design. For instance, when the working format is a wafer, numerous assemblies are simultaneously batch manufactured on a single wafer and then separated from one another during singulation. As another example, when the working format is a strip (or reel-to-reel) form, the chips are individually attached to the strip. Semiconductor chip assemblies manufactured using a strip can be chip size packages, ball grid arrays, or other structures. The wafer-based approach employs fewer steps and is less time consuming than the strip-based approach, however the strip-based approach is easier to control and has better dimensional stability than the wafer-based approach since aligning the through-holes with the pads involves a single chip rather than the entire wafer.

Advantageously, the semiconductor chip assembly of the present invention is reliable and inexpensive. The adhesive and/or insulative base protects the chip from handling damage and provides a known dielectric barrier for the conductive trace. The insulative base prevents solder reflow at the top surface from contacting or electrically shorting the underlying conductive trace. The tapered pillar yields enhanced reliability for the next level assembly that exceeds that of conventional BGA packages. The mode of the connection shifts from the initial mechanical coupling to metallurgical coupling to assure sufficient metallurgical bond strength. Furthermore, the conductive trace can be mechanically and metallurgically coupled to the chip without wire bonding, TAB, flip-chip bonding, plating, polishing, or solder joints, although the process is flexible enough to accommodate these techniques if desired. As a result, the assembly of the present invention significantly enhances throughput, yield and performance characteristics compared to conventional packaging techniques. Moreover, the assembly of the present invention is well-suited for use with materials compatible with copper chip and lead-free environmental requirements.

Various changes and modifications to the presently preferred embodiments described herein will be apparent to those skilled in the art. For instance, the materials, dimensions and shapes described above are merely exemplary. Such changes and modifications may be made without departing from the spirit and scope of the present invention as defined in the appended claims.

I claim:

1. A method of connecting a conductive trace to a semiconductor chip, comprising:

aligning a conductive pad on a chip with a through-hole in a conductive trace while a base covers the through-hole on a side opposite the chip, wherein the conductive trace and the base are different materials;

removing some or all of the base, thereby exposing the through-hole; and forming a connection joint in the through-hole that electrically connects the conductive trace and the pad.

2. The method of claim 1, including mechanically attaching the chip to the conductive trace using an adhesive after aligning the pad and the through-hole and before removing some or all of the base.

3. The method of claim 2, including forming an opening in the adhesive directly beneath the through-hole thereby exposing the pad after removing some or all of the base and before forming the connection joint.

4. The method of claim 1, including attaching the conductive trace to the base by electroplating the conductive trace on the base.

5. The method of claim 1, wherein removing some or all of the base includes applying an etch that is selective of the base with respect to the conductive trace.

6. The method of claim 5, wherein removing some or all of the base includes selectively etching the base to remove a portion of the base over the through-hole and to form a pillar in the base that covers and is connected to a portion of the conductive trace.

7. The method of claim 5, wherein removing some or all of the base includes removing all of the base.

8. The method of claim 1, wherein forming the connection joint includes wire bonding a ball bond in the through-hole that contacts and electrically connects the conductive trace and the pad.

9. The method of claim 1, wherein the conductive trace includes gold and the base is essentially copper.

10. The method of claim 1, wherein the conductive trace is an inner lead of a TAB lead.

11. A method of connecting a conductive trace to a semiconductor chip, comprising:

providing a semiconductor chip that includes a conductive pad;

attaching a conductive trace to a base, wherein the conductive trace includes a through-hole, and the conductive trace and the base are different materials; then disposing an adhesive between the chip and the conductive trace, thereby mechanically attaching the chip to the conductive trace such that the pad is aligned with the through-hole and the adhesive covers the pad; then removing some or all of the base, thereby exposing the through-hole; then forming an opening in the adhesive below the through-hole;

exposing the pad through the opening and the through-hole; and then forming a connection joint in the through-hole that extends through the opening and electrically connects the conductive trace and the pad.

12. The method of claim 11, wherein attaching the conductive trace to the base includes electroplating the conductive trace on the base.

13. The method of claim 11, wherein disposing the adhesive includes providing the adhesive in the through-hole, and forming the opening includes removing the adhesive in the through-hole.

14. The method of claim 11, wherein forming the opening in the adhesive includes applying a laser etch.

15. The method of claim 14, wherein the laser etch is blocked by the conductive trace and the pad.

16. The method of claim 14, wherein the laser etch includes projection laser ablation.

17. The method of claim 11, wherein the pad includes a central region directly beneath the through-hole and a peripheral region not directly beneath the through-hole, the opening and the through-hole expose the central region without exposing the peripheral region, and the connection joint contacts the central region without contacting the peripheral region.

18. The method of claim 11, wherein all of the pad is directly beneath the through-hole, the opening and the through-hole expose all of the pad, and the connection joint contacts all of the pad.

19. The method of claim 11, including contacting the adhesive to the conductive trace and the base, and then contacting the adhesive to the chip.

20. The method of claim 11, wherein the adhesive is a thermosetting epoxy.

21. The method of claim 11, wherein the adhesive is a thermoplastic polyimide.

22. The method of claim 11, including forming the conductive trace and the through-hole simultaneously.

23. The method of claim 11, wherein the connection joint is a ball bond formed by thermocompression or thermosonic wire bonding.

24. The method of claim 23, wherein the ball bond consists of a deformed wire ball.

25. The method of claim 23, wherein the ball bond only contacts the conductive trace, the adhesive and the pad.

26. The method of claim 23, wherein the ball bond contacts all of a contact region of the conductive trace that includes a top surface of the conductive trace opposite the chip and that spans 360 degrees around the through-hole.

27. The method of claim 23, wherein the connection joint has a mushroom-shape.

28. The method of claim 11, wherein the conductive trace includes gold, the connection joint is essentially gold, and the base is essentially copper.

29. The method of claim 11, wherein the connection joint is devoid of a solder joint.

30. The method of claim 11, wherein the conductive trace is an inner lead of a TAB lead.

31. A method of connecting a conductive trace to a semiconductor chip, comprising the following steps in the sequence set forth:

forming a conductive trace on a base, wherein the conductive trace and the base are different materials;

disposing an insulative adhesive between a chip and the conductive trace, thereby mechanically attaching the chip to the conductive trace, wherein the chip includes upper and lower surfaces, the upper surface includes a pad, the conductive trace includes top and bottom surfaces and a through-hole therebetween, the adhesive contacts the upper and bottom surfaces, and the through-hole is aligned with the pad;

applying an etch to the base that is selective of the base with respect to the conductive trace and the adhesive, thereby exposing the through-hole;

applying an etch to the adhesive that removes any of the adhesive in the through-hole and forms an opening in the adhesive directly below the through-hole, thereby exposing the pad through the through-hole and the opening; and forming a connection joint inside the through-hole and the opening that contacts and electrically connects the conductive trace and the pad.

32. The method of claim 31, wherein forming the conductive trace on the base includes electroplating the conductive trace on the base.

33. The method of claim 32, including forming a photoresist layer on the base that selectively exposes a portion of the base that defines the conductive trace and the through-hole, and electroplating the conductive trace on the selectively exposed portion of the base, thereby simultaneously forming the conductive trace and the through-hole.

34. The method of claim 31, wherein forming the connection joint includes applying thermocompression or thermosonic wire bonding using a capillary that inserts a wire ball into the through-hole and presses the wire ball against the conductive trace and the pad to form a ball bond inside the through-hole that contacts and bonds to the conductive trace and the pad.

35. The method of claim 31, wherein applying the etch to the base forms a pillar in the base that covers and is connected to a portion of the conductive trace.

36. The method of claim 31, wherein applying the etch to the base removes all of the base.

37. The method of claim 31, wherein applying the etch to the base includes applying a wet chemical etch, and applying the etch to the adhesive includes applying a laser etch that ablates the adhesive.

38. The method of claim 31, wherein the conductive trace includes gold, the connection joint is essentially gold, and the base is essentially copper.

39. The method of claim 31, wherein the connection joint is devoid of a solder joint.

40. The method of claim 31, wherein the conductive trace is an inner lead of a TAB lead.

41. A method of connecting a conductive trace to a semiconductor chip, comprising the following steps in the sequence set forth:

providing a metal layer base;

providing a plating mask on the base, wherein the plating mask includes an opening that exposes a portion of the base;

electroplating a conductive trace on the exposed portion of the base through the opening in the plating mask, wherein the conductive trace includes top and bottom surfaces and a through-hole therebetween, the top surface contacts the base, and the bottom surface is exposed;

removing the plating mask, thereby exposing outer edges of the conductive trace between the top and bottom surfaces and sidewalls of the through-hole;

mechanically attaching a chip to the conductive trace without contacting the chip to the conductive trace using an insulative adhesive, wherein the chip includes upper and lower surfaces, the upper surface includes a pad, the through-hole is aligned with the pad, and the adhesive contacts the upper and bottom surfaces;

applying an etch that is selective of the base with respect to the conductive trace and the adhesive, thereby removing the base and exposing the top surface and the through-hole;

applying an etch that is selective of the adhesive with respect to the conductive trace and the pad, thereby removing the adhesive in the through-hole and forming an opening in the adhesive beneath the through-hole and exposing the pad through the opening in the adhesive and the through-hole; and forming a connection joint in the through-hole that extends through the opening in the adhesive and contacts and electrically connects the conductive trace and the pad.

42. The method of claim 41, wherein the plating mask is photoresist.

43. The method of claim 41, wherein the adhesive is thermoplastic polyimide.

44. The method of claim 41, wherein applying the etch that is selective of the base includes applying a wet chemical etch that is highly selective of copper with respect to gold.

45. The method of claim 41, wherein applying the etch that is selective of the adhesive includes applying a laser that ablates the adhesive in and directly beneath the through-hole.

46. The method of claim 41, wherein forming the connection joint includes plating a metal on the conductive trace and the pad.

47. The method of claim 41, wherein forming the connection joint includes wire bonding a ball bond on the conductive trace and the pad.

48. The method of claim 41, wherein the conductive trace provides horizontal fan-out routing between the pad and an outer edge of the chip.

49. The method of claim 41, wherein the conductive trace and the chip are devoid of solder joints.

50. The method of claim 41, wherein the conductive trace is an inner lead of a TAB lead.

51. A method of connecting a conductive trace to a semiconductor chip, comprising the following steps in the sequence set forth:

providing a metal layer base;

providing a plating mask on the base, wherein the plating mask includes an opening that exposes a portion of the base;

electroplating a conductive trace on the exposed portion of the base through the opening in the plating mask, wherein the conductive trace includes top and bottom surfaces and a through-hole therebetween, the top surface contacts the base, and the bottom surface is exposed;

removing the plating mask, thereby exposing outer edges of the conductive trace between the top and bottom surfaces and sidewalls of the through-hole;

mechanically attaching a chip to the conductive trace without contacting the chip to the conductive trace using an insulative adhesive, wherein the chip includes upper and lower surfaces, the upper surface includes a pad, the through-hole is aligned with the pad, and the adhesive contacts the upper and bottom surfaces;

applying an etch that is selective of the base with respect to the conductive trace and the adhesive, thereby removing a portion of the base above the through-hole and exposing the through-hole and forming a pillar in the base outside the through-hole that covers and is connected to a portion of the conductive trace;

applying an etch that is selective of the adhesive with respect to the conductive trace and the pad, thereby removing the adhesive in the through-hole and forming an opening in the adhesive beneath the through-hole and exposing the pad through the opening in the adhesive and the through-hole; and forming a connection joint in the through-hole that extends through the opening in the adhesive and contacts and electrically connects the conductive trace and the pad.

52. The method of claim 51, wherein the plating mask is photoresist.

53. The method of claim 51, wherein the adhesive is thermoplastic polyimide.

54. The method of claim 51, wherein applying the etch that is selective of the base includes applying a wet chemical etch that is highly selective of copper with respect to gold.

55. The method of claim 51, wherein applying the etch that is selective of the adhesive includes applying a laser that ablates the adhesive in and directly beneath the through-hole.

56. The method of claim 51, wherein forming the connection joint includes plating a metal on the conductive trace and the pad.

57. The method of claim 51, wherein forming the connection joint includes wire bonding a ball bond on the conductive trace and the pad.

58. The method of claim 51, wherein the conductive trace provides horizontal fan-in routing between the pad and a center of the chip.

59. The method of claim 51, wherein the conductive trace and the chip are devoid of solder joints.

60. The method of claim 51, wherein the conductive trace and the chip are part of a chip size package.

61. A method of connecting a conductive trace to a semiconductor chip, comprising the following steps in the sequence set forth:

providing an adhesive between and in contact with a chip and a conductive trace, wherein the chip includes a pad, the conductive trace includes a through-hole, the pad is aligned with the through-hole, a base contacts and covers a top surface of the conductive trace opposite the chip and covers the through-hole, and the base and the conductive trace are different metallic materials;

removing at least a portion of the base from the conductive trace, thereby exposing the through-hole;

positioning a capillary with a wire ball extending therefrom over the through-hole, wherein the wire ball is connected to a wire that is fed through the capillary;

moving the capillary towards the through-hole so that the wire ball enters the through-hole and contacts a contact region of the conductive trace and the pad;

moving the capillary further towards the through-hole so that the wire ball deforms into a ball bond that substantially fills the through-hole and remains connected to the wire; and moving the capillary away from the through-hole, disconnecting the ball bond from the wire, and cooling the ball bond so that the ball bond forms a ball bond connection joint that is inside the through-hole and contacts and electrically connects the contact region of the conductive trace and the pad.

62. The method of claim 61, wherein the capillary forms the ball bond using thermocompression wire bonding.

63. The method of claim 61, wherein the capillary forms the ball bond using thermosonic wire bonding.

64. The method of claim 61, wherein the wire ball contacts the pad and then contacts the contact region of the conductive trace.

65. The method of claim 61, wherein the wire ball contacts the contact region of the conductive trace and then contacts the pad.

66. The method of claim 61, wherein the wire ball deforms into a shape that fills the through-hole and an opening in the adhesive beneath the through-hole.

67. The method of claim 61, wherein the ball bond connection joint has a mushroom-shape that includes a stem and a cap, the stem contacts the contact region of the conductive trace and the pad and fills the through-hole, and the cap contacts the contact region of the conductive trace and is positioned above the through-hole.

68. The method of claim 61, wherein the ball bond connection joint only contacts the chip, the adhesive and the conductive trace.

69. The method of claim 61, including moving the capillary in a horizontal loop to form the ball bond connection joint.

70. The method of claim 61, including opening a clamp that releases the wire as the capillary is moved towards and away from the through-hole, and closing the clamp thereby holding the wire as the ball bond connection joint is disconnected from the wire.

* * * * *